(12) United States Patent
Kim et al.

(10) Patent No.: US 11,437,455 B2
(45) Date of Patent: Sep. 6, 2022

(54) DISPLAY DEVICE AND METHOD OF MANUFACTURING THE SAME

(71) Applicant: Samsung Display Co., LTD., Yongin-si (KR)

(72) Inventors: Keun Woo Kim, Yongin-si (KR); Hye Na Kwak, Yongin-si (KR); Doo Na Kim, Yongin-si (KR); Sang Sub Kim, Yongin-si (KR); Thanh Tien Nguyen, Yongin-si (KR); Yong Su Lee, Yongin-si (KR); Jae Hwan Chu, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 90 days.

(21) Appl. No.: 16/856,780

(22) Filed: Apr. 23, 2020

(65) Prior Publication Data

US 2021/0036080 A1 Feb. 4, 2021

(30) Foreign Application Priority Data

Jul. 30, 2019 (KR) .......................... 10-2019-0092503

(51) Int. Cl.
*G09G 3/3233* (2016.01)
*H01L 27/32* (2006.01)
(Continued)

(52) U.S. Cl.
CPC ....... *H01L 27/3262* (2013.01); *G09G 3/3233* (2013.01); *G09G 2300/0426* (2013.01);
(Continued)

(58) Field of Classification Search
CPC ......... G09G 3/3233; G09G 2300/0426; G09G 2300/0809; G09G 2320/0233;
(Continued)

(56) References Cited

U.S. PATENT DOCUMENTS 7,491,591 B2 2/2009 Choi
2008/0062112 A1* 3/2008 Umezaki ............. G02F 1/13452
345/100

(Continued)

FOREIGN PATENT DOCUMENTS

KR 10-0579188 5/2006
KR 10-2020-0124365 11/2020

*Primary Examiner* — Robert J Michaud
(74) *Attorney, Agent, or Firm* — Kile Park Reed & Houtteman PLLC

(57) ABSTRACT

A display device includes a pixel disposed in a display region. The pixel includes a light-emitting element connected between a first power source and a second power source; a first transistor connected between the first power source and the light-emitting element to control a driving current flowing in the light-emitting element in response to a voltage of a first node; and at least one switching transistor to transmit a data signal or a voltage of an initialization power source to the first node. The switching transistor includes a first channel region, a first conductive region and a second conductive region which are respectively disposed at opposite sides of the first channel region, and a first wide band-gap region disposed between the first channel region and the second conductive region.

24 Claims, 10 Drawing Sheets

(51) Int. Cl.
*H01L 27/12* (2006.01)
*H01L 29/786* (2006.01)
*H01L 29/66* (2006.01)

(52) U.S. Cl.
CPC .............. *G09G 2300/0809* (2013.01); *G09G 2320/0233* (2013.01); *H01L 27/1222* (2013.01); *H01L 27/1274* (2013.01); *H01L 27/1288* (2013.01); *H01L 29/66757* (2013.01); *H01L 29/78675* (2013.01); *H01L 29/78696* (2013.01); *H01L 2227/323* (2013.01)

(58) Field of Classification Search
CPC ............. H01L 27/3262; H01L 27/1222; H01L 27/1288; H01L 29/78672
See application file for complete search history.

(56) References Cited

U.S. PATENT DOCUMENTS

2011/0147754 A1* 6/2011 Isa .................... H01L 29/78696
257/60
2020/0342815 A1 10/2020 Kim et al.

\* cited by examiner

DISPLAY DEVICE AND METHOD OF MANUFACTURING THE SAME

CROSS-REFERENCE TO RELATED APPLICATIONS

This application claims priority to and benefits of Korean Patent Application No. 10-2019-0092503 under 35 U.S.C. § 119, filed in the Korean Intellectual Property Office on Jul. 30, 2019, the entire contents of which are incorporated herein by reference.

BACKGROUND

1. Technical Field disclosure relates to a display device and a method of manufacturing the same.

2. Description of the Related Art

Display devices display an image using pixels disposed in a display region. The pixels may be connected to scan lines and data lines and may include transistors. For example, a pixel of an active light-emitting display device may include a light-emitting element, a driving transistor, and at least one switching transistor.

In order to express desired luminance in the pixels during an emission period of each frame, a gate voltage of the driving transistor should be maintained stable. However, due to the characteristics of transistors, a leakage current may occur in the pixel. The leakage current may cause a variation in gate voltage of the driving transistor, and in this case, desired luminance may not be sufficiently expressed in each pixel.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An embodiment of the disclosure provides a display device capable of effectively reducing or preventing a leakage current of a pixel, and a method of manufacturing the same.

A display device includes a pixel disposed in a display region. The pixel includes a light-emitting element connected between a first power source and a second power source; a first transistor connected between the first power source and the light-emitting element to control a driving current flowing in the light-emitting element in response to a voltage of a first node; and at least one switching transistor to transmit a data signal or a voltage of an initialization power source to the first node. The at least one switching transistor includes a first channel region, a first conductive region and a second conductive region which are respectively disposed at opposite sides of the first channel region, and a first wide band-gap region disposed between the first channel region and the second conductive region.

In an embodiment, the first channel region, the first conductive region, and the second conductive region may include polysilicon, and the first wide band-gap region may include amorphous silicon.

In an embodiment, the at least one switching transistor may include a plurality of transistors connected in series with each other.

In an embodiment, the at least one switching transistor may further include a second channel region disposed between the first channel region and the second conductive region, a third conductive region disposed between the first channel region and the second channel region, and a second wide band-gap region disposed between the second channel region and the third conductive region. The first wide band-gap region may be disposed between the first channel region and the third conductive region.

In an embodiment, the first wide band-gap region may be in direct contact with the first channel region and the third conductive region, and the second wide band-gap region may be in direct contact with the second channel region and the third conductive region.

In an embodiment, the at least one switching transistor may include a first gate electrode overlapping the first channel region and a second gate electrode overlapping the second channel region. The first gate electrode and the second gate electrode may be electrically connected to each other.

In an embodiment, the at least one switching transistor may further include a second wide band-gap region disposed between the first channel region and the first conductive region.

In an embodiment, each of the first wide band-gap region and the second wide band-gap region may include amorphous silicon.

In an embodiment, the at least one switching transistor may include at least one of a second transistor connected between a first electrode of the first transistor and a data line the second transistor including a gate electrode connected to a scan line, a third transistor connected between a second electrode of the first transistor and the first node the third transistor including a gate electrode connected to the scan line, and a fourth transistor connected between the first node and the initialization power source and the fourth transistor including a gate electrode connected to a first control line.

In an embodiment, the third transistor may include the first channel region, the first conductive region, the second conductive region, and the first wide band-gap region.

In an embodiment, the third transistor may include a plurality of transistors connected in series with each other.

In an embodiment, the third transistor may further include a second channel region disposed between the first channel region and the second conductive region, a third conductive region disposed between the first channel region and the second channel region, and a second wide band-gap region disposed between the second channel region and the third conductive region. The first wide band-gap region may be disposed between the first channel region and the third conductive region.

In an embodiment, the third transistor may include a first gate electrode overlapping the first channel region and a second gate electrode overlapping the second channel region. The first gate electrode and the second gate electrode may be commonly connected to the scan line.

In an embodiment, the fourth transistor may include the first channel region, the first conductive region, the second conductive region, and the first wide band-gap region.

In an embodiment, the fourth transistor may include a plurality of transistors connected in series with each other.

In an embodiment, the second transistor may include the first channel region, the first conductive region, the second conductive region, the first wide band-gap region and a second wide band-gap region disposed between the first channel region and the first conductive region.

In an embodiment, the pixel may include a plurality of switching transistors, and a predetermined number of the switching transistors may include the first wide band-gap region.

A method of manufacturing a display device including a switching transistor including forming a semiconductor pattern in a switching transistor region; disposing a first mask and a second mask on a first region and a second region, respectively, of the semiconductor pattern and exposing the remaining regions of the semiconductor pattern; crystallizing the remaining regions of the semiconductor pattern to include separating amorphous regions corresponding to the first and second regions and crystalline regions corresponding to the remaining regions; forming a first insulating film on the semiconductor pattern; forming a gate electrode on a region of the crystalline region; and doping another region of the crystalline region with impurities with the gate electrode as a mask.

In an embodiment, the switching transistor may include a plurality of transistors connected in series with each other. In this case, a region between channel regions of the transistors may be doped with impurities to form a conductive region, and the amorphous region may be formed between the conductive region and the channel regions.

In an embodiment, the switching transistor may be formed as a single transistor. In this case, the amorphous regions may be formed at opposite sides of the crystalline region overlapping the gate electrode.

DETAILED DESCRIPTION OF THE EMBODIMENTS

Figure 1:
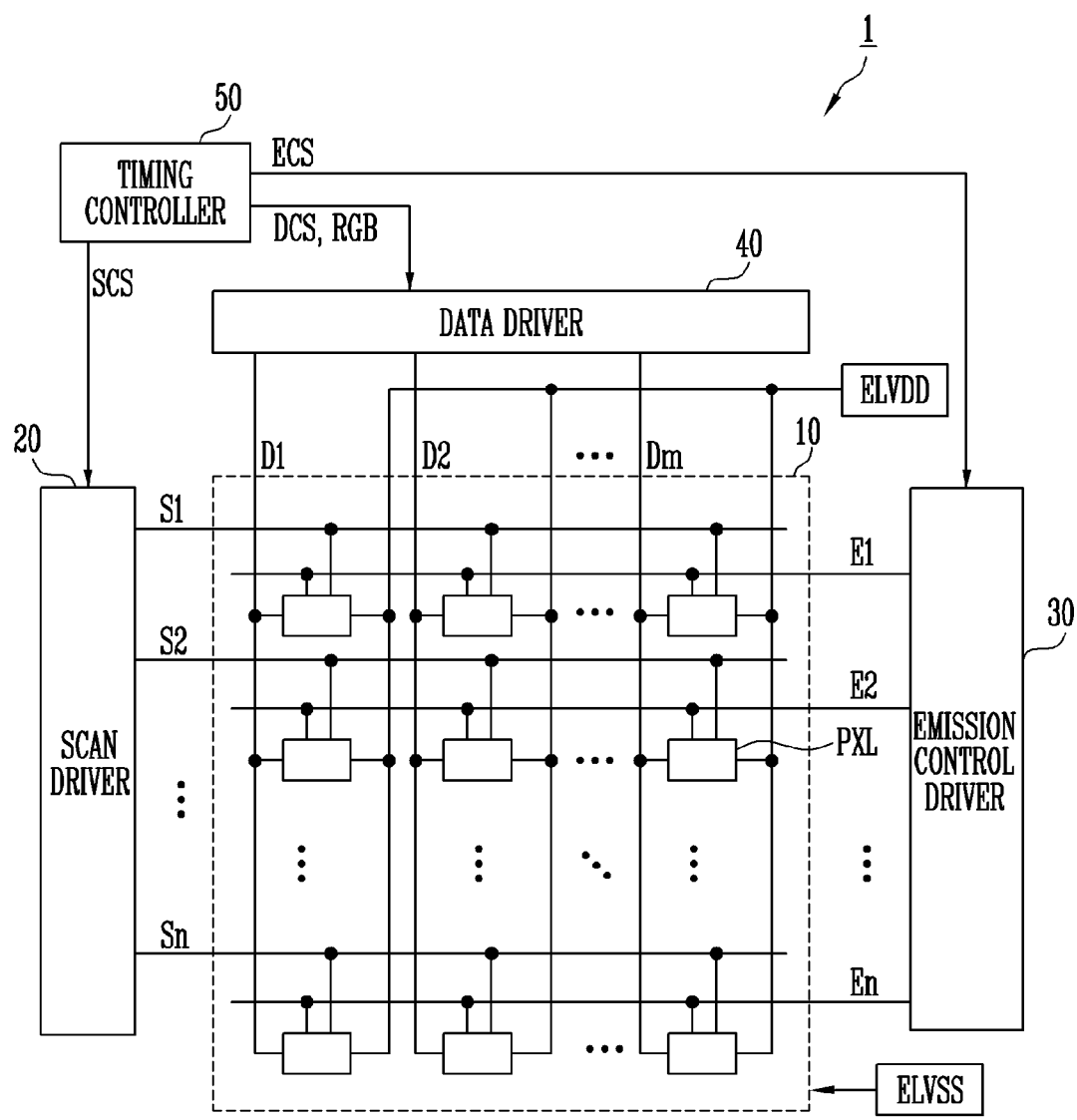
FIG. 1 illustrates a display device according to an embodiment.

Although the disclosure may be modified in various manners and have additional embodiments, embodiments are illustrated in the accompanying drawings and will be mainly described in the specification. However, the scope of the disclosure is not limited to the embodiments in the accompanying drawings and the specification and should be construed as including all the changes, equivalents and substitutions included in the spirit and scope of the disclosure Some of the parts which are not associated with the description may not be provided in order to describe embodiments of the disclosure and like reference numerals refer to like elements throughout the specification.

In the drawings, sizes and thicknesses of elements may be enlarged for better understanding clarity and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Although terms such as first and second are used to describe various elements, the elements are not limited by such terms. Such terms are merely used to differentiate one element from another element. Therefore, a first element mentioned below may also be a second element within the spirit and scope of the disclosure.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 illustrates a display device 1 according to an embodiment. Although FIG. 1 illustrates a light-emitting display device including light-emitting elements as an example of the display device 1, the display device 1 according to the disclosure is not limited thereto.

Referring to FIG. 1, the display device 1 according to the embodiment may include a display region 10 in which pixels PXL are disposed, a scan driver 20 to drive the pixels PXL, an emission control driver 30, a data driver 40, and a timing controller 50.

The display region 10 may include the pixels PXL connected to scan lines S1 to Sn, emission control lines E1 to En, and data lines D1 to Dm. In the description of embodiments, the "connection" may inclusively refer to electrical and/or physical connections. For example, the pixels PXL may be electrically connected to the scan lines S1 to Sn, the emission control lines E1 to En, and the data lines D1 to Dm.

In other embodiments, the emission control lines E1 to En may be omitted. For example, the structure and/or driving method of the pixels PXL may determine whether the emission control lines E1 to En may be provided. As an example, according to embodiments, the pixels PXL may be connected to at least one control line which is not shown. In this case, the operations of the pixels PXL may be controlled by a control signal supplied from the control line.

The pixels PXL may receive scan signals, emission control signals (if applicable), and data signals from the scan lines S1 to Sn, the emission control lines E1 to En (if applicable), and the data lines D1 to Dm. The pixels PXL may receive driving powers of a first power source ELVDD and a second power source ELVSS. The pixels PXL may be connected to other power sources (for example, initialization power source) according to the structure and/or driving method thereof of the pixels PXL.

When the scan signal is supplied from each of the scan lines S1 to Sn, the above-described pixels PXL may receive the data signal from each of the data lines D1 to Dm and emit light with luminance corresponding to the data signal. Accordingly, an image corresponding to the data signal of each frame may be displayed in the display region 10.

Each pixel PXL may include a light-emitting element and a pixel circuit for driving the light-emitting element. The pixel circuit may control a driving current flowing from the first power source ELVDD to the second power source ELVSS in response to a data signal. Accordingly, the pixel circuit may include a driving transistor and at least one switching transistor.

The scan driver 20 may receive a scan driving control signal SCS from the timing controller 50 and supply scan signals to the scan lines S1 to Sn in response to the scan driving control signal SCS. For example, the scan driver 20 may sequentially supply the scan signals to the scan lines S1 to Sn in response to the scan driving control signal SCS. When the scan signals are supplied to the scan lines S1 to Sn, the pixels PXL connected to the scan lines may be selected by the scan signals.

According to embodiments, the scan signals may be used to select the pixels PXL in a horizontal line unit. For example, the scan signal may have a gate-on voltage (for example, a low voltage) by which a transistor of each of the pixels PXL connected to the data lines D1 to Dm may be turned on. The scan signals may be supplied to the pixels PXL of a horizontal line corresponding to each horizontal period. During a period in which the scan signals are supplied, the pixels PXL receiving the scan signals may be connected to the data lines D1 to Dm to receive the data signals.

The emission control driver 30 may receive an emission driving control signal ECS from the timing controller 50 and supply emission control signals to the emission control lines E1 to En in response to the emission driving control signal ECS. In an example, the emission control driver 30 may sequentially supply the emission control signals to the emission control lines E1 to En in response to the emission driving control signal ECS. The structure and/or driving method of the pixels PXL may determine whether the emission control driver 30 may be provided. Thus, the emission control driver 30 may be omitted.

The emission control signal may be used to control an emission period (for example, an emission time point and/or an emission duration time) of the pixels PXL. For example, the emission control signal may have a gate-off voltage (for example, a high voltage) by which at least one switching transistor positioned on a current path of each of the pixels PXL may be turned off. In this case, the pixel PXL receiving the emission control signal may be set to be in a non-emission state during a period in which the emission control signal is supplied and may be set to be in an emission state during other periods. When a data signal corresponding to a black gray level is supplied to a certain pixel PXL, the pixel PXL may maintain a non-emission state in response to the data signal even when the emission control signal having the gate-off voltage is not supplied.

The data driver 40 may receive a data driving control signal DCS and image data RGB from the timing controller 50 and supply data signals to the data lines D1 to Dm in response to the data driving control signal DCS and the image data RGB. The data signals supplied to the data lines D1 to Dm may be supplied to the pixels PXL selected by the scan signals.

The timing controller 50 may receive various timing control signals (for example, a vertical/horizontal synchronization signal and a main clock signal) from an external device (for example, a host processor) and may generate the scan driving control signal SCS, the emission driving control signal ECS, and the data driving control signal DCS in response to the timing control signals. The scan driving control signal SCS, the emission driving control signal ECS, and the data driving control signal DCS may be supplied to the scan driver 20, the emission control driver 30, and the data driver 40, respectively.

The scan driving control signal SCS may include a first start pulse (for example, a scan start pulse) and a first clock signal (for example, at least one scan clock signal). The first start pulse may be used to control an output timing of a first scan signal (for example, a scan signal supplied to a first scan line S1). The first clock signal may be used to sequentially shift the first start pulses.

The emission driving control signal ECS may include a second start pulse (for example, an emission start pulse) and a second clock signal (for example, at least one emission clock signal). The second start pulse may be used to control an output timing of a first emission control signal (for example, an emission control signal supplied to a first emission control line E1). The second clock signal may be used to sequentially shift the second start pulses.

The data driving control signal DCS may include a source sampling pulse, a source sampling clock, and a source output enable signal. A sampling operation of data may be controlled by the data driving control signal DCS.

For example, the timing controller 50 may receive input image data from the outside and may realign the input image data to generate the image data RGB. The above-described timing controller 50 may supply the image data RGB to the data driver 40. The image data RGB supplied to the data driver 40 may be used to generate data signals to be supplied to the pixels PXL.

Figure 2:
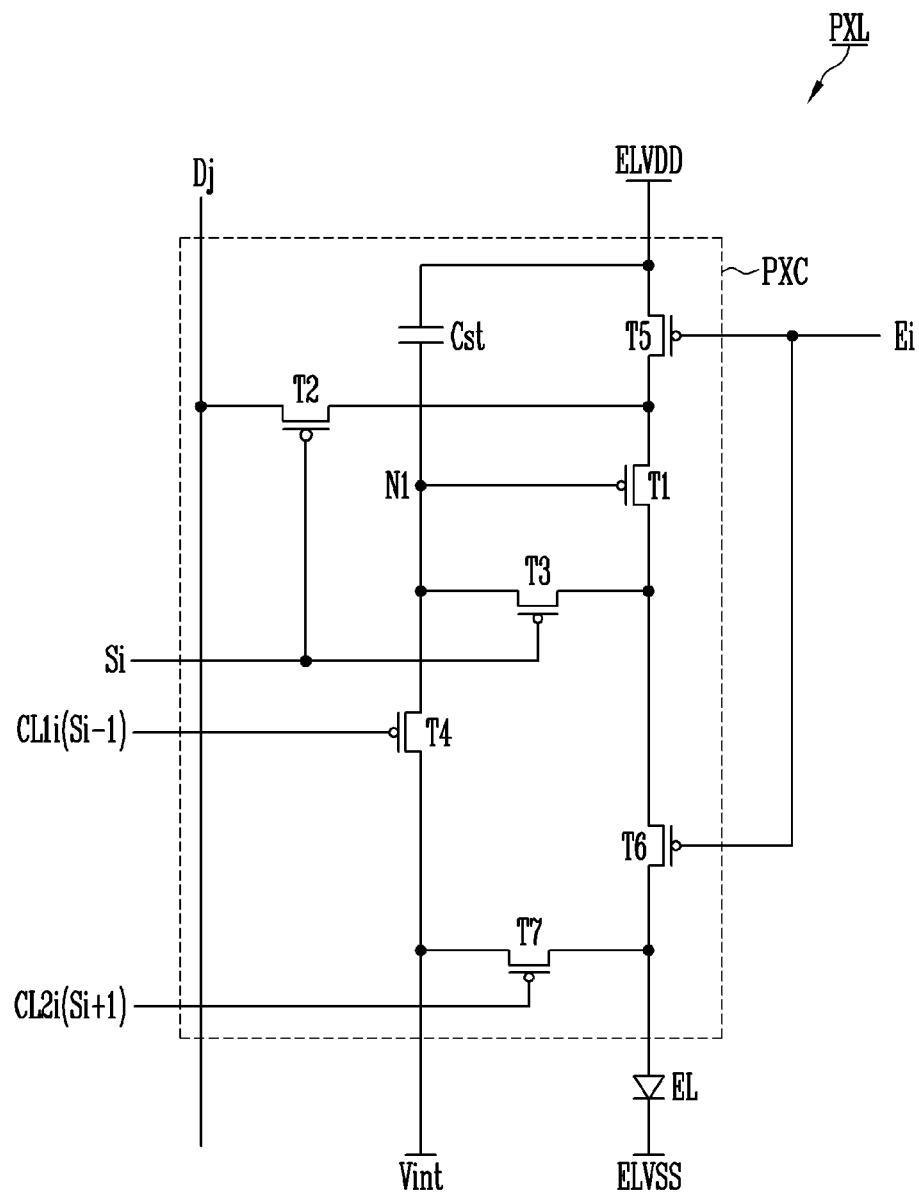
FIGS. 2 and 3 illustrate pixels PXL according to embodiments.
Figure 3:
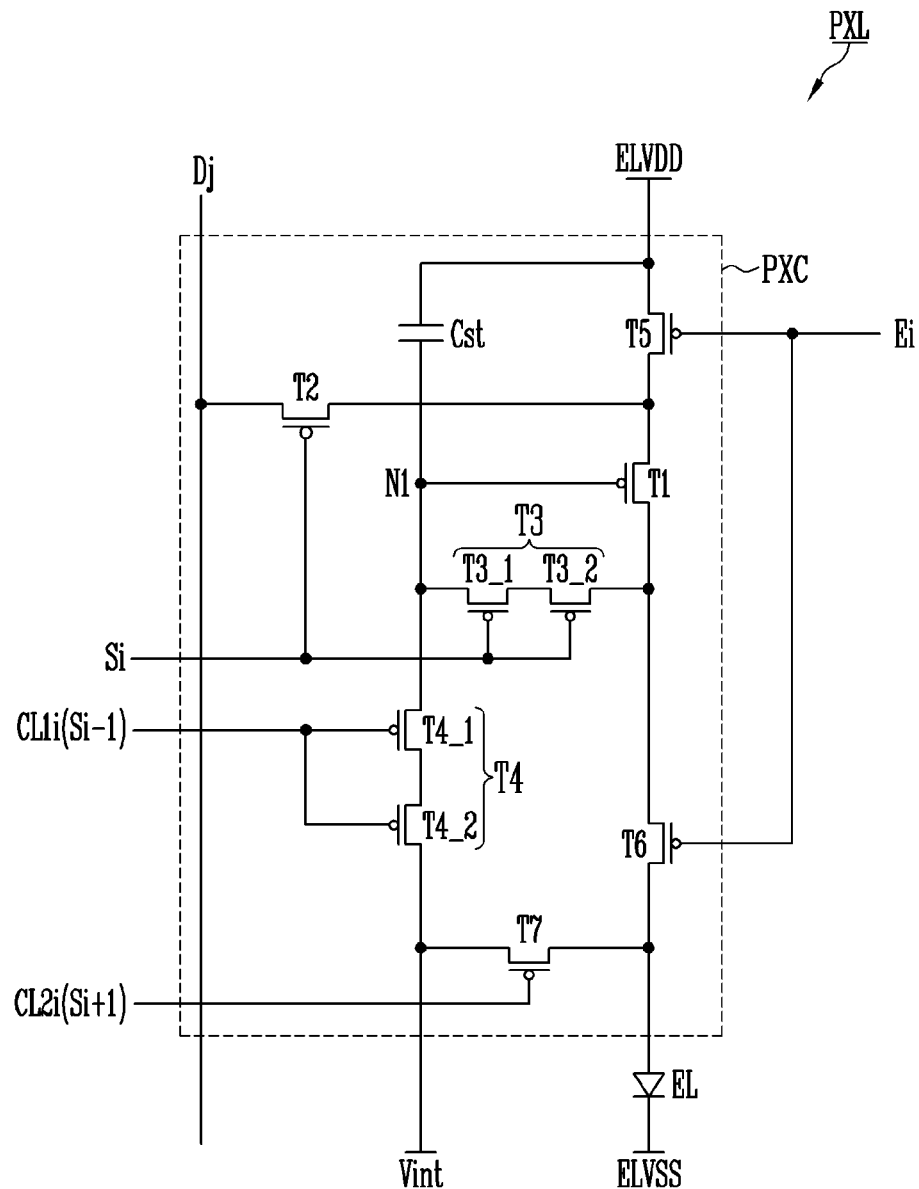

FIGS. 2 and 3 illustrate pixels PXL according to embodiments. For example, FIGS. 2 and 3 illustrate different embodiments of the pixel PXL that may be disposed in the display region 10 of FIG. 1. The pixel PXL may be disposed in an $i^{th}$ pixel row (for example, an $i^{th}$ horizontal line) and a $j^{th}$ pixel column (for example, a $j^{th}$ vertical line) of the display region 10 and may be connected to an $i^{th}$ scan line Si, an $i^{th}$ emission control line Ei, and a $j^{th}$ data line Dj (wherein i and j are natural numbers). For example, the pixel PXL may be connected to at least one control line. In an example, the pixel PXL may be connected to an $i^{th}$ first control line CL1$i$ and an $i^{th}$ second control line CL2$i$.

According to embodiments, the pixels PXL disposed in the pixel region 10 of FIG. 1 may have substantially the same or similar structure. Hereinafter, the "$i^{th}$ scan line Si," the "$i^{th}$ emission control line Ei," and the "$j^{th}$ data line Dj" will be respectively referred to as a "scan line Si", an "emission control line Ei," and a "data line Dj". The "$i^{th}$ first control line CL1$i$" and the "$i^{th}$ second control line CL2$i$" will be respectively referred to as a "first control line CL1$i$" and a "second control line CL2$i$."

Referring to FIG. 2, the pixel PXL according to an embodiment may include a light-emitting element EL and a pixel circuit PXC to drive the light-emitting element EL. According to embodiments, the light-emitting element EL may be connected between the pixel circuit PXC and a second power source ELVSS, but the position of the light-emitting element EL is not limited thereto. For example, in an embodiment, the light-emitting element EL may be connected between a first power source ELVDD and the pixel circuit PXC.

According to embodiments, the light-emitting element EL may be an organic light-emitting diode (OLED) including an organic light-emitting layer but is not limited thereto. For example, in an embodiment, the pixel PXL may include micro light-emitting elements having a small size in a range of about a nanoscale to about a microscale.

The light-emitting element EL may be connected between the first power source ELVDD and the second power source ELVSS. For example, an anode electrode of the light-emitting element EL may be connected to the first power source ELVDD through the pixel circuit PXC, and a cathode electrode of the light-emitting element EL may be connected to the second power source ELVSS. When a driving current is supplied from a first transistor T1, the light-emitting element EL generates light with luminance corresponding to the driving current.

The first power source ELVDD and the second power source ELVSS may have a potential difference that allows the light-emitting element EL to emit light. For example, the first power source ELVDD may be a high potential pixel power source, and the second power source ELVSS may be a low potential pixel power source having a potential that may be lower than that of the first power source ELVDD by a threshold voltage or more of the light-emitting element EL.

The pixel circuit PXC may include a driving transistor, at least one switching transistor, and a storage capacitor Cst. For example, the pixel circuit PXC may include a first transistor T1 as the driving transistor, second to seventh transistors T2 to T7 as switching transistors, and the storage capacitor Cst. At least one switching transistor of the switching transistors may be provided to transmit a data signal or a voltage of an initialization power source to a first node N1 to which a gate electrode of the driving transistor is connected.

It is to be understood that the structure of the pixel circuit PXC may be variously changed according to embodiments. For example, the pixel PXL may include the pixel circuit PXC having various structures and/or driving methods.

It is to be understood that the assigning of the transistors (T1 through T7) as driving or switching transistors is arbitrary. For example, the driving transistor may be any of the second to seventh transistors T2 to T7 and is thus not limited to the first transistor T1. Additionally, the number of the transistors is not limited to that which is illustrated and may include any number of transistors within the spirt and scope of the disclosure.

In an embodiment, each of the first to seventh transistors T1 to T7 may be a p-type transistor. However, the disclosure is not limited thereto. For example, in an embodiment, each of the first to seventh transistors T1 to T7 may be an n-type transistor. Alternatively, some of the first to seventh transistors T1 to T7 may be p-type transistors, and others thereof may be n-type transistors.

The first transistor T1 may be connected or disposed between the first power source ELVDD and the second power source ELVSS on a current path of a driving current. In an example, the first transistor T1 may be connected or disposed between the first power source ELVDD and the light-emitting element EL. For example, a first electrode (for example, a source electrode) of the first transistor T1 may be connected to the first power source ELVDD through the fifth transistor T5, and a second electrode (for example, a drain electrode) of the first transistor T1 may be connected to the anode electrode of the light-emitting element EL through the sixth transistor T6. The gate electrode of the first transistor T1 may be connected to the first node N1.

The above-described first transistor T1 controls a driving current flowing in the light-emitting element EL in response to a gate voltage, for example, a voltage of the first node N1. For example, during an emission period of each frame, the first transistor T1 may control a driving current flowing from the first power source ELVDD to the second power source ELVSS through the light-emitting element EL in response to the voltage of the first node N1.

The second transistor T2 may be connected or disposed between the data line Dj and the first electrode of the first transistor T1. A gate electrode of the second transistor T2 may be connected to the scan line Si.

When a scan signal having a gate-on voltage is supplied to the scan line Si, the second transistor T2 may be turned on to connect the data line Dj and the first electrode of the first transistor T1. Therefore, when the second transistor T2 is turned on, a data signal from the data line Dj may be transmitted to the first electrode of the first transistor T1. During a period in which the second transistor T2 is turned on by the scan signal, the third transistor T3 may also be turned on by the scan signal, and the first transistor T1 may be turned on in the form of a diode connection by the third transistor T3. Accordingly, the data signal from the data line Dj may be transmitted to the first node N1 through the second transistor T2, the first transistor T1, and the third transistor T3. The storage capacitor Cst may be charged with a voltage corresponding to the data signal and a threshold voltage of the first transistor T1.

The third transistor T3 may be connected or disposed between the second electrode of the first transistor T1 and the first node N1. A gate electrode of the third transistor T3 may be connected or disposed to the scan line Si. When a scan signal having a gate-on voltage is supplied to the scan line Si, the third transistor T3 may be turned on to connect the second electrode of the first transistor T1 and the first node N1. Therefore, when the third transistor T3 is turned on, the first transistor T1 may be connected in the form of a diode.

The fourth transistor T4 may be connected or disposed between the first node N1 and the initialization power source Vint. A gate electrode of the fourth transistor T4 may be connected to the first control line CL1$i$. According to embodiments, the first control line CL1$i$ may be an initialization control line for initializing the pixels PXL of an $i^{th}$ horizontal line and may receive an initialization control signal having a gate-on voltage during an initialization period before a scan signal having a gate-on voltage is supplied to each scan line Si.

In an embodiment, the first control line CL1$i$ may be any one scan line of previous scan lines for selecting the pixels PXL of previous horizontal lines, for example, an $i^{th}$_1 scan line Si_1 for selecting the pixels PXL of an immediately previous horizontal line. In this case, the initialization control signal supplied to the first control line CL1$i$ may be an $(i-1)^{th}$ scan signal supplied to the $(i-1)^{th}$ scan line Si-1. In an embodiment, the first control line CL1$i$ may be a control line formed separately from scan lines S1 to Sn of the pixels PXL.

When a first control signal having a gate-on voltage is supplied to the first control line CL1$i$, the fourth transistor T4 may be turned on. When the fourth transistor T4 is turned on, the voltage of the initialization power source Vint may be transmitted to the first node N1, and thus, the voltage of the first node N1 may be initialized based on the voltage of the initialization power source Vint.

The voltage of the initialization power source Vint may be set to a voltage less than or equal to a voltage of the data signal. For example, the voltage of the initialization power source Vint may be set to be less than or equal to the lowest voltage of the data signal. When the voltage of the first node N1 is initialized based on the voltage of the initialization power source Vint before a data signal of a current frame is supplied to each pixel PXL, the first transistor T1 may be diode-connected in a forward direction during a scan period of each horizontal line (for example, a period in which the scan signal is supplied to each scan line Si) irrespective of a data signal of a previous frame. Accordingly, irrespective of the data signal of the previous frame, it may be possible to stably transmit the data signal of the current frame to the first node N1.

The fifth transistor T5 may be connected or disposed between the first power source ELVDD and the first transistor T1. A gate electrode of the fifth transistor T5 may be connected to the emission control line Ei. The fifth transistor T5 may be turned off when an emission control signal having a gate-off voltage is supplied to the emission control line Ei, and is turned on otherwise.

The sixth transistor T6 may be connected or disposed between the first transistor T1 and the light-emitting element EL. A gate electrode of the sixth transistor T6 may be connected to the emission control line Ei. The sixth transistor T6 may be turned off when an emission control signal having a gate-off voltage is supplied to the emission control line Ei, and may be turned on otherwise.

For example, the fifth and sixth transistors T5 and T6 may be turned on or turned off at the same time in response to the emission control signal to control an emission period of the pixels PXL. When the fifth and sixth transistors T5 and T6 are turned on, a current path through which a driving current flows may be formed in the pixel PXL. Accordingly, the pixel PXL may emit light with luminance corresponding to the voltage of the first node N1. On the contrary, when the fifth and sixth transistors T5 and T6 are turned off, the current path may be blocked, and thus, the pixel PXL may not emit light.

According to embodiments, an emission control signal may be supplied as a signal having a gate-off voltage to turn off the fifth and sixth transistors T5 and T6 during an initialization period and a data programming period (for example, a scan period) of the pixel PXL. In an example, during a period in which each of a scan signal, a first control signal, and a second control signal has a gate-on voltage, an emission control signal having a gate-off voltage may be supplied to overlap the scan signal, the first control signal, and the second control signal. After a voltage of each of the scan signal, the first control signal, and the second control signal is changed into a gate-off voltage, a voltage of the emission control signal may be changed into a gate-on voltage, and thus, an emission period of each frame may start. Accordingly, the data signal may be stably stored in the pixel PXL prior to an emission period of each frame.

The seventh transistor T7 may be connected or disposed between the initialization power source Vint and the anode electrode of the light-emitting element EL. A gate electrode of the seventh transistor T7 may be connected to the second control line CL2i. According to embodiments, the second control line CL2i may be a bypass control line for initializing a voltage charged in an organic capacitor (for example, a parasitic capacitor formed due to the structure of the light-emitting element EL) formed in the light-emitting element EL of each of the pixels positioned in the $i^{th}$ horizontal line. The second control line CL2i may receive a bypass control signal having a gate-on voltage before each emission period.

In an embodiment, the second control line CL2i may be any one scan line of subsequent scan lines for selecting the pixels PXL of the subsequent horizontal lines. For example, the second control line CL2i may be an $(i+1)^{th}$ scan line Si+1 for selecting the pixels PXL of an $(i+1)^{th}$ horizontal line but is not limited thereto. For example, in an embodiment, the second control line CL2i may be a current scan line (for example, the scan line Si) of each pixel PXL or may be a control line formed separately from the scan lines S1 to Sn of the pixels PXL.

Before an emission period of each frame, when a second control signal having a gate-on voltage is supplied to the second control line CL2i, the seventh transistor T7 may be turned on to supply the voltage of the initialization power source Vint to the anode electrode of the light-emitting element EL. Therefore, the pixel PXL may exhibit more uniform luminance characteristics in response to each data signal.

The storage capacitor Cst may be connected to the first power source ELVDD and the first node N1. The above-described storage capacitor Cst may be charged with a voltage corresponding to a data signal and a threshold voltage of the first transistor T1.

As in the above-described embodiment, each pixel PXL may include transistors including a driving transistor (for example, the first transistor T1) and at least one switching transistor (for example, at least one of the second to seventh transistors T2 to T7). In an embodiment, the transistors may be formed as transistors having similar structures, sizes, and/or types. In an embodiment, at least one of the transistors may be formed as a transistor having a structure, size, and/or type which may be different from those of the remaining transistors.

For example, the driving transistor may have a relatively long channel region in order to secure an operation section in a wider voltage range. In an example, the driving transistor may be formed as a long-channel transistor. Each switching transistor may have a channel region relatively shorter than that of the driving transistor in order to efficiently utilize a limited pixel region while ensuring faster operating characteristics. Each switching transistor may be formed as a short-channel transistor. However, according to embodiments, when a channel region of the switching transistor is shortened, a leakage current occurring in the switching transistor may be increased to cause a variation in luminance of the pixel PXL.

Referring to FIG. 3, in order to reduce a leakage current, at least one switching transistor may include transistors connected in series with each other. For example, each of third and fourth transistors T3 and T4, which are capable of changing a voltage of a first node N1 when a leakage current occurs in an off-state, may be formed to include transistors connected in series with each other. For example, each of the third transistor T3 and the fourth transistor T4 may be formed as a transistor with a dual structure including two transistors connected in series.

By way of example, the third transistor T3 may include two transistors such as a $3^{th}\_1$ transistor T3_1 and a $3^{th}\_2$ transistor T3_2 connected in series between the first node N1 and a second electrode of a first transistor T1. Gate electrodes of the $3^{th}\_1$ transistor T3_1 and the $3^{th}\_2$ transistor T3_2 may be commonly connected to the scan line Si. Accordingly, the $3^{th}\_1$ transistor T3_1 and the $3^{th}\_2$ transistor T3_2 may be turned on or off at the same time in response to a scan signal.

Similarly, the fourth transistor T4 may include two transistors such as a $4^{th}\_1$ transistor T4_1 and a $4^{th}\_2$ transistor T4_2 connected in series between the first node N1 and an initialization power source Vint. Gate electrodes of the $4^{th}\_1$ transistor T4_1 and the $4^{th}\_2$ transistor T4_2 may be commonly connected to the first control line CL1i. Accordingly, the $4^{th}\_1$ transistor T4_1 and the $4^{th}\_2$ transistor T4_2 may be turned on or off at the same time in response to a first control signal (for example, a previous scan signal).

When the third transistor T3 and the fourth transistor T4 are provided as a multiple-transistor having at least a dual structure, a leakage current of each of the third transistor T3 and the fourth transistor T4 may be reduced or prevented. Thus, it may be possible to reduce or prevent the leakage current through the third transistor T3 and the fourth transistor T4 in an off-state during an emission period of each frame, thereby stably maintaining the voltage of the first node N1. Accordingly, an expression of a gray level of the pixel PXL may be increased, and image quality of the display device 1 may be improved.

FIG. 3 illustrates an embodiment in which each of the third and fourth transistors T3 and T4 is provided as the transistor with the dual structure, but the disclosure is not limited thereto. For example, in an embodiment, among the third transistor T3 and the fourth transistor T4, only one transistor (for example, the third transistor T3) may be formed as a transistor with a multi-structure, and the other transistor (for example, the fourth transistor T4) may be formed as a transistor with a single structure. In an embodiment, a switching transistor other than the third transistor T3 and the fourth transistor T4, for example, at least one transistor (for example, at least one transistor of a second transistor T2 and fifth to seventh transistors T5 to T7) may also be formed as a transistor with a multi-structure including transistors connected in series with each other.

In the pixel PXL and the display device 1 including the pixel PXL according to the above-described embodiments, it may be possible to reduce or decrease a variation in gate voltage of the first transistor T1, for example, the voltage of the first node N1, which is caused by a leakage current. Accordingly, the pixel PXL may more accurately express a gray level corresponding to each data signal during each emission period.

It is to be understood that in the disclosure, the structure of the pixel PXL is not limited to the embodiments shown in FIGS. 2 and 3. For example, the pixel PXL may include the pixel circuit PXC having various structures and/or driving methods within the spirit and scope of the disclosure.

In the embodiments of FIGS. 2 and 3, each transistor may be illustrated as being a p-type transistor, but the disclosure is not limited thereto. For example, at least one transistor of the first to seventh transistors T1 to T7 may be an n-type transistor. In this case, a gate-on voltage for turning on the n-type transistor may be a high voltage.

A voltage of a data signal may be determined according to the type of the first transistor T1. For example, when the first transistor T1 is a p-type transistor, as a gray level to be expressed becomes higher, a data signal having a lower voltage may be supplied to each pixel PXL. When the first transistor T1 is an n-type transistor, as a gray level to be expressed becomes higher, a data signal having a higher voltage may be supplied to each pixel PXL.

For example, in the disclosure, the types of the transistors constituting the pixel PXL and the voltage levels of various control signals (for example, a scan signal, a data signal, a first control signal, a second control signal, and/or an emission control signal) for controlling the transistors may be variously changed according to embodiments.

Figure 4:
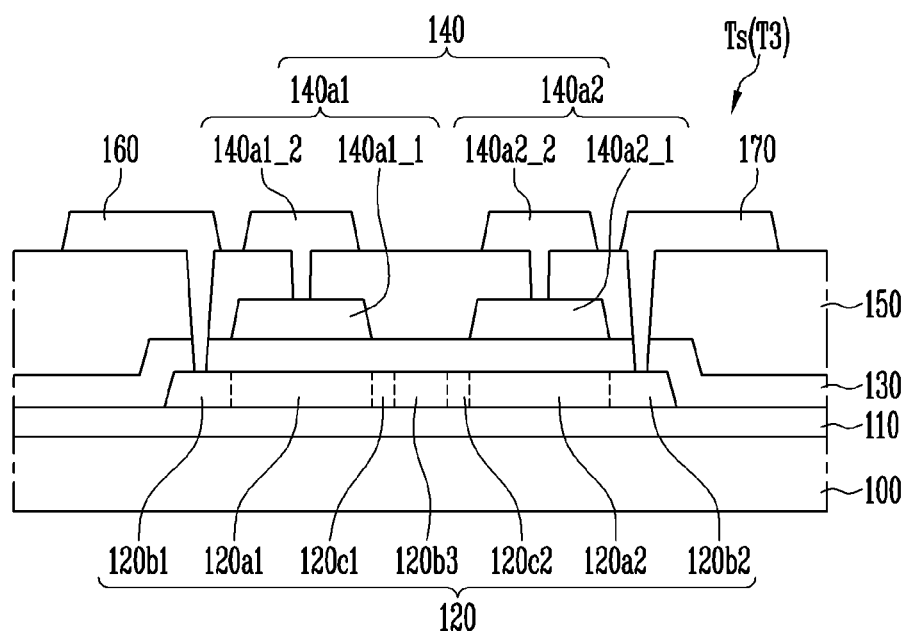
FIGS. 4 and 5 illustrate a switching transistor according to an embodiment.
Figure 5:
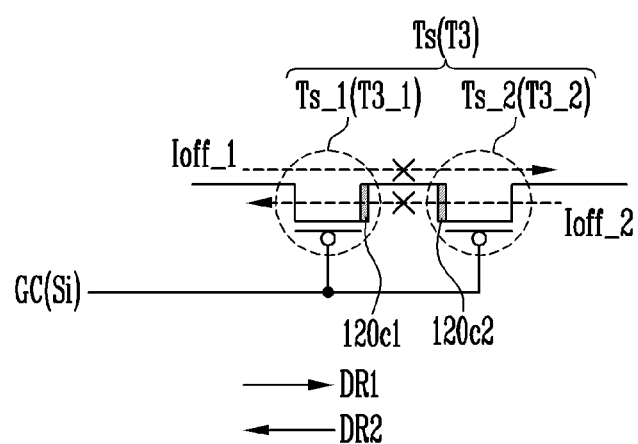

FIGS. 4 and 5 illustrate a switching transistor Ts according to an embodiment. For example, FIG. 4 illustrates a schematic cross-sectional structure of the switching transistor Ts, and FIG. 5 illustrates an equivalent circuit diagram of the switching transistor Ts.

The switching transistor Ts according to the embodiment of FIGS. 4 and 5 may be any one switching transistor provided in the pixel PXL according to the embodiments of FIGS. 1 to 3. For example, the switching transistor Ts may be the third transistor T3 with a dual structure according to the embodiment of FIG. 3.

Referring to FIGS. 3 to 5, the switching transistor Ts according to the embodiment may include an active layer pattern 120 which may be disposed on one surface of a base layer 100 on which a buffer layer 110 may be formed, a gate electrode 140 which overlaps one region of the active layer pattern 120 with a first insulating film 130 interposed therebetween, first and second electrodes 160 and 170 which are spaced apart from the active layer pattern 120 with the first insulating film 130 and a second insulating film 150 interposed therebetween and are connected to different regions of the active layer pattern 120.

According to embodiments, the switching transistor Ts may include a first switching transistor Ts_1 and a second switching transistor Ts_2 connected in series with each other. In an example, the first switching transistor Ts_1 and the second switching transistor Ts_2 may be the 3th_1 transistor T3_1 and the 3th_2 transistor T3_2 shown in FIG. 3.

For example, the switching transistor Ts may include channel regions. In an example, the switching transistor Ts may include a first channel region 120a1 that forms a channel of the first switching transistor Ts_1 and a second channel region 120a2 that forms a channel of the second switching transistor Ts_2. A conductive region may be disposed at each of opposite sides of each of the first channel region 120a1 and the second channel region 120a2.

For example, a first conductive region 120b1 and a third conductive region 120b3 may be respectively disposed at opposite sides of the first channel region 120a1. One of the first conductive region 120b1 and the third conductive region 120b3 may be a source region of the first switching transistor Ts_1, and the other thereof may be a drain region of the first switching transistor Ts_1. In an example, when the first conductive region 120b1 is the source region of the first switching transistor Ts_1, the third conductive region 120b3 may be the drain region of the first switching transistor Ts_1. On the contrary, when the first conductive region 120b1 is the drain region of the first switching transistor Ts_1, the third conductive region 120b3 may be the source region of the first switching transistor Ts_1. This may be changed according to a carrier type (for example, an n-type or p-type) and a current direction of the first switching transistor Ts_1.

Similarly, a second conductive region 120b2 and the third conductive region 120b3 may be respectively disposed at opposite sides of the second channel region 120a2. One of the second conductive region 120b2 and the third conductive region 120b3 may be a source region of the second switching transistor Ts_2, and the other thereof may be a drain region of the second switching transistor Ts_2. In an example, when the second conductive region 120b2 is the drain region of the second switching transistor Ts_2, the third conductive region 120b3 may be the source region of the second switching transistor Ts_2. On the contrary, when the second conductive region 120b2 is the source region of the second switching transistor Ts_2, the third conductive region 120b3 may be the drain region of the second switching transistor Ts_2. This may be changed according to a carrier type (for example, an n-type or p-type) and a current direction of the second switching transistor Ts_2.

In an embodiment, the first switching transistor Ts_1 and the second switching transistor Ts_2 may share any one conductive region. For example, the first switching transistor Ts_1 and the second switching transistor Ts_2 may share the third conductive region 120b3. However, the disclosure is not limited thereto. For example, in an embodiment, the conductive regions of the first switching transistor Ts_1 and the second switching transistor Ts_2 may be formed in patterns separated apart from each other, and any conductive regions of the first and second switching transistors Ts_1 and Ts_2 (for example, the source region of the first switching transistor Ts_1 and the drain region of the second switching transistor Ts_2) may be electrically connected to each other.

According to exemplary embodiments, the switching transistor Ts may include at least one wide band-gap region. In an example, the switching transistor Ts may include a first wide band-gap region 120c1 disposed at one side of the first channel region 120a1 and a second wide band-gap region 120c2 disposed at one side of the second channel region 120a2.

According to embodiments, the first wide band-gap region 120c1 and the second wide band-gap region 120c2 may be positioned between the first channel region 120a1 and the second channel region 120a2. For example, the first wide band-gap region 120c1 may be disposed between the first channel region 120a1 and the third conductive region 120b3, and the second wide band-gap region 120c2 may be disposed between the second channel region 120a2 and the third conductive region 120b3.

The switching transistor Ts according to the above-described embodiment may include at least one channel region, at least two conductive regions respectively disposed at opposite sides of the channel region, and at least one wide band-gap region disposed between the channel region and any one of the conductive regions. For example, when the switching transistor Ts is has one or more dual structures or multi-structures, the switching transistor Ts may include at least one additional channel region, at least one conductive region, and at least one wide band-gap region.

For example, the switching transistor Ts may include the first channel region 120a1, the first conductive region 120b1 and the third conductive region 120b3 which are respectively disposed at opposite sides of the first channel region 120a1, and the first wide band-gap region 120c1 which is disposed between the first channel region 120a1 and the third conductive region 120b3. For example, the switching transistor Ts may include the second channel region 120a2 disposed between the first channel region 120a1 and the second conductive region 120b2, the third conductive region 120b3 which may be disposed between the first channel region 120a1 and the second channel region 120b1, and the second wide band-gap region 120c2 which may be disposed between the second channel region 120a2 and the third conductive region 120b3. In this case, the first wide band-gap region 120c1 may be disposed between the first channel region 120a1 and the third conductive region 120b3.

For example, the first and second wide band-gap regions 120c1 and 120c2 may be respectively disposed at opposite sides of the third conductive region 120b3. For example, the first wide band-gap region 120c1 may be disposed between the first channel region 120a1 and the third conductive region 120b3 to be in direct contact with the first channel region 120a1 and the third conductive region 120b3. The second wide band-gap region 120c2 may be disposed between the second channel region 120a2 and the third conductive region 120b3 to be in direct contact with the second channel region 120a2 and the third conductive region 120b3. In other words, the active layer pattern 120 may include a conductive region, a channel region, a wide band gap region, a conductive region, a wide band gap region, a channel region and a conductive region in symmetrical sequence in a schematic cross-sectional view as illustrated for example in FIG. 4.

In an example, the active layer pattern 120 of the switching transistor Ts may include the first conductive region 120b1, the first channel region 120a1, the first wide band-gap region 120c1, the third conductive region 120b3, the second wide band-gap region 120c2, the second channel region 120a2, and the second conductive region 120b2, which are sequentially disposed in one direction on the buffer layer 110 as described above. Here, the first conductive region 120b1, the first channel region 120a1, the first wide band-gap region 120c1, and the third conductive region 120b3 may constitute an active layer pattern of the first switching transistor Ts_1. The second conductive region 120b2, the second channel region 120a2, the second wide band-gap region 120c2, and the third conductive region 120b3 may constitute an active layer pattern of the second switching transistor Ts_2. The active layer patterns of the first and second switching transistors Ts_1 and Ts_2 may share the third conductive region 120b3 and may be integrally formed with each other.

The active layer pattern 120 may have a relatively wide band-gap in the first and second wide band-gap regions 120c1 and 120c2 and may have a relatively low band-gap in the remaining regions. For example, each of the first and second wide band-gap regions 120c1 and 120c2 may be an amorphous silicon region including amorphous silicon a-Si. Each of the first and second channel regions 120a1 and 120a2 and the first to third conductive regions 120b1 to 120b3 may be a polysilicon region including polysilicon poly-Si.

When the switching transistor Ts is a transistor with a dual structure, the switching transistor Ts may include the gate electrode 140 with a dual structure. For example, the gate electrode 140 may include a first gate electrode 140a1 overlapping the first channel region 120a1 and a second gate electrode 140a2 overlapping the second channel region 120a2. Similarly, when the switching transistor Ts is a transistor with a multi-structure including three or more transistors, the switching transistor Ts may include three or more channel regions and three or more gate electrodes overlapping with the channel regions.

In an embodiment, the gate electrode 140 may include multiple layers. For example, the first gate electrode 140a1 may include multiple layers including a lower electrode 140a1_1 disposed between the first insulating film 130 and the second insulating film 150 and an upper electrode 140a1_2 connected to the lower electrode 140a1_1 and disposed on the second insulating film 150. Similarly, the second gate electrode 140a2 may include multiple layers including a lower electrode 140a2_1 disposed between the first insulating film 130 and the second insulating film 150 and an upper electrode 140a2_2 connected to the lower electrode 140a2_1 and disposed on the second insulating film 150. When the gate electrode 140 includes the multiple layers, resistance of the gate electrode 140 and a gate control line GC (for example, the scan line Si) connected thereto may be reduced to reduce or prevent a signal delay.

However, the disclosure is not limited thereto. For example, in an embodiment, one of the first gate electrode 140a1 and the second gate electrode 140a2 may include multiple layers, and the other thereof may include a single layer. In an embodiment, each of the first gate electrode 140a1 and the second gate electrode 140a2 may include a single layer, and the first gate electrode 140a1 and the second gate electrode 140a2 may be disposed in the same layer or different layers. In an example, each of the first gate electrode 140a1 and the second gate electrode 140a2 may also include the lower electrodes 140a1_1 and 140a2_1 positioned between the first insulating film 130 and the second insulating film 150 or only the lower electrodes 140a1_1 and 140a2_1 positioned between the first insulating film 130 and the second insulating film 150.

The first gate electrode 140a1 and the second gate electrode 140a2 are electrically connected to each other. For example, the first gate electrode 140a1 and the second gate electrode 140a2 may be connected to the same gate control line GC. In an example, when the switching transistor Ts is the third transistor T3 of FIG. 3, the first gate electrode 140a1 and the second gate electrode 140a2 may be commonly connected to the scan line Si.

The first electrode 160 and the second electrode 170 may be disposed on the second insulating film 150 to be connected to different regions of the active layer pattern 120. For example, the first electrode 160 may be connected to the first conductive region 120b1 through a first contact hole passing through the first and second insulating films 130 and 150, and the second electrode 170 may be connected to the second conductive region 120b2 through a second contact hole passing through the first and second insulating films 130 and 150.

According to embodiments, the first electrode 160 may be one electrode of a source electrode and a drain electrode of the switching transistor Ts, and the second electrode 170 may be the other electrode thereof. For example, when the first electrode 160 is the source electrode, the second electrode 170 may be the drain electrode. On the contrary, when the first electrode 160 is the drain electrode, the second electrode 170 may be the source electrode.

On the other hand, the position of the first electrode 160 and the second electrode 170 in the disclosure is not particularly limited and may be variously changed according to embodiments. As an example, according to embodiments, at least one electrode of the first electrode 160 and the second electrode 170 may be omitted.

For example, when the switching transistor Ts is connected directly to another circuit element (for example, at least one other transistor and/or capacitor) through the first conductive region 120b1, the first electrode 160 may be omitted. The first conductive region 120*b*1 may be the source or drain electrode of the switching transistor Ts. Similarly, when the switching transistor Ts is connected directly to another circuit element through the second conductive region 120*b*2, the second electrode 170 may be omitted. The second conductive region 120*b*2 may be the source or drain electrode of the switching transistor Ts. Alternatively, as other examples, the first and/or second conductive regions 120*b*1 and 120*b*2 may be considered as the source and/or drain electrodes of the switching transistor Ts, and the first and/or second electrodes 160 may be considered as wires connected to one electrode of the switching transistor Ts or electrodes of other circuit elements.

The switching transistor Ts according to the above-described embodiment may exhibit improved leakage current characteristics in both directions. For example, in a first direction DR1 and a second direction DR2, the first wide band-gap region 120*c*1 or the second wide band-gap region 120*c*2 may be positioned between the channel region and the drain region of any one transistor of the first and second switching transistors Ts_1 and Ts_2. Accordingly, a leakage current may be low in both directions of the switching transistor Ts.

Due to characteristics of a transistor, a leakage current may occur between a channel region and a drain region. Therefore, when a region having a wide band-gap (for example, the first and/or second wide band-gap regions 120*c*1 and 120*c*2) are disposed between the channel region and the drain region of each of the first switching transistor Ts_1 and/or the second switching transistor Ts_2, it may be possible to effectively reduce or prevent a leakage current that may occur in the switching transistor Ts.

For example, when each of the first and second switching transistors Ts_1 and Ts_2 is a p-type transistor, in view of a first leakage current Ioff_1 in the first direction DR1 of FIG. 5, the first conductive region 120*b*1 and the third conductive region 120*b*3 may be the source region and the drain region of the first switching transistor Ts_1, respectively. Therefore, the first wide band-gap region 120*c*1 may be positioned at a drain-to-active junction between the first channel region 120*a*1 which is the channel region of the first switching transistor Ts_1 and the third conductive region 120*b*3 which is the drain region of the first switching transistor Ts_1. When a band-gap is widened between the channel region and the drain region of the first switching transistor Ts_1 by the first wide band-gap region 120*c*1, it may be possible to effectively reduce or prevent a leakage current of the first switching transistor Ts_1.

A leakage current of a transistor may mainly appear as the sum of two kinds of leakage currents, for example, a thermal generation current $I_G$ and a gate-induced-drain-leakage current $I_{GIDL}$. Each of the thermal generation current $I_G$ and the gate-induced-drain-leakage current $G_{IDL}$ may be a band-gap function with a band-gap as a variable. As a band-gap is increased, each of the thermal generation current $I_G$ and the gate-induced-drain-leakage current $I_{GIDL}$ is reduced. Therefore, the first leakage current Ioff_1 in the first direction DR1 may be suppressed by the first wide band-gap region 120*c*1 in the first switching transistor Ts_1.

On the other hand, in view of a second leakage current Ioff_2 in a second direction DR2 of FIG. 5, the second conductive region 120*b*2 and the third conductive region 120*b*3 may be the source region and the drain region of the second switching transistor Ts_2, respectively. Therefore, the second wide band-gap region 120*c*2 may be positioned at a junction between the second channel region 120*a*2 which may be the channel region of the second switching transistor Ts_2 and the third conductive region 120*b*3 which may be the drain region of the second switching transistor Ts_2.

Therefore, when a band-gap is widened between the channel region and the drain region of the second switching transistor Ts_2 by the second wide band-gap region 120*c*2, it may be possible to effectively reduce or prevent a leakage current of the second switching transistor Ts_2. For example, the second leakage current Ioff_2 in the second direction DR2 may be suppressed by the second wide band-gap region 120*c*2 in the second switching transistor Ts_2.

As described above, in the embodiment of the disclosure, at least one switching transistor Ts may include at least one dual structure including transistors (for example, the first and second switching transistors Ts_1 and Ts_2). A junction band-gap widening (JBW) structure may be formed by wide band-gap regions (for example, the first and second wide band-gap regions 120*c*1 and 120*c*2) being disposed between a conductive region (for example, the third conductive region 120*b*3) and channel regions (for example, the first and second channel regions 120*a*1 and 120*a*2) between the transistors. Accordingly, even though a wide band-gap region is formed at only one side of each of the channel regions, both bidirectional leakage currents may be effectively reduced or prevented. Even when the active layer pattern 120 is formed to be relatively short, it may be possible to obtain an effect of reducing a leakage current due to each wide band-gap region.

Therefore, a limited pixel area may be efficiently utilized, and leakage current characteristics of the pixel PXL may also be improved. Accordingly, the switching transistor Ts according to the embodiment of the disclosure may be easily formed even in the high resolution display device 1 having a relatively narrow pixel region, thereby obtaining an effect of reducing a leakage current of the pixel PXL.

According to the above-described embodiment, at least one switching transistor Ts constituting the pixel PXL may be formed to have at least a dual structure, thereby primarily lowering a leakage current. A wide band-gap region may be formed between a channel region and a drain region of at least one switching transistor (for example, the first or second switching transistors Ts_1 and Ts_2) constituting the switching structure Ts with a multi-structure in each of the first direction DR1 and the second direction DR2, thereby more effectively reducing or preventing a leakage current.

For example, when the third transistor T3 of FIG. 3 is implemented with the switching transistor Ts according to an embodiment of FIGS. 4 and 5, a leakage current of the third transistor T3 in an off-state may be considerably reduced. In an embodiment, the third transistor T3, which may not be connected directly to a power source or the like, and may be disposed closer to a central region of a pixel region than other switching transistors of the pixel PXL. Therefore, there may be less of a possibility that aging is performed on the third transistor T3 compared with other switching transistors. In this case, there is also a possibility that leakage current characteristics of the third transistor T3 may be deteriorated. However, when the third transistor T3 is formed to include a wide band-gap region as shown in FIGS. 4 and 5, the leakage current characteristics of the third transistor T3 may be improved. Accordingly, an expression of a gray level of the pixel PXL may be improved by stabilizing the voltage of the first node N1.

The structure of the switching transistor Ts according to the embodiment of FIGS. 4 and 5 may not be applicable only to the third transistor T3. For example, the fourth transistor T4 of FIG. 3 may be similar to the switching transistor Ts according to the embodiment of FIGS. 4 and 5. In an example, the fourth transistor T4 may include the first channel region 120a1, the first conductive region 120b1, the second conductive region 120b2, and the first wide band-gap region 120c1 according to the embodiment of FIGS. 4 and 5. For example, when the fourth transistor T4 is a transistor with one or more dual or multi-structure structures, the fourth transistor T4 may include the second channel region 120a2, the third conductive region 120b3, and the second wide band-gap region 120c2. In an example, the first switching transistor Ts_1 and the second switching transistor Ts_2 of FIGS. 4 and 5 may be the 4$^{th}$_1 transistor T4_1 and the 4$^{th}$_2 transistor T4_2 of FIG. 3. Accordingly, a leakage current of the fourth transistor T4 may be considerably reduced, thereby stabilizing the voltage of the first node N1 and improving an expression of a gray level of the pixel PXL.

For example, in embodiments of the disclosure, the structure of the switching transistor Ts according to the embodiment of FIGS. 4 and 5 may be applied to at least one switching transistor constituting the pixel PXL within the spirit and scope of the invention. For example, as in the embodiments of FIGS. 2 and 3, when each pixel PXL includes switching transistors, such as the second to seventh transistors T2 to T7, a wide band-gap region may be formed in only some of, or a predetermined number of, the switching transistors which may be vulnerable to a leakage current or in which a reduction in leakage current is more important or prominent among any given transistors. In an example, each of the third and/or fourth transistors T3 and T4 of FIG. 3 may be implemented as the switching transistor Ts according to the embodiment of FIGS. 4 and 5. Alternatively, according to embodiments, the second transistor T2 may be formed to have a dual structure and the same structure as the switching transistor Ts according to the embodiment of FIGS. 4 and 5.

According to the above-described embodiment, a leakage current of the pixel PXL may be effectively reduced. Therefore, it may be possible to improve an expression of a gray level of the pixel PXL and image quality of the display device 1 including the pixel PXL.

Figure 6:
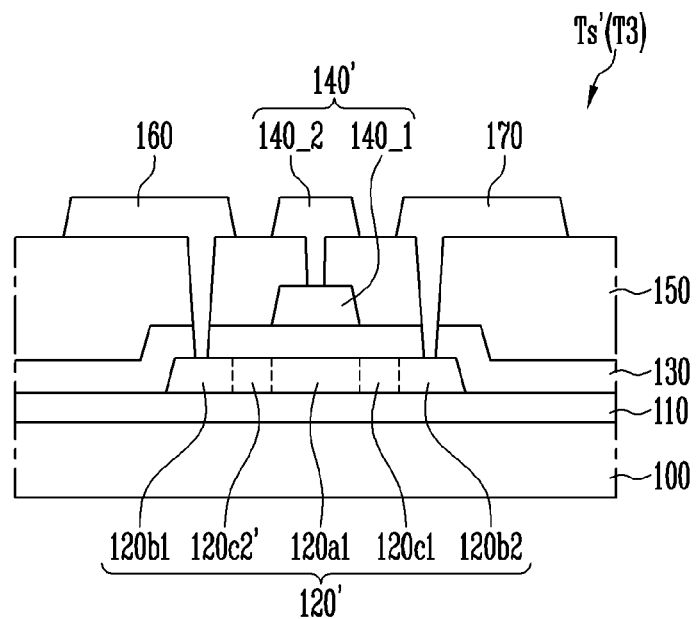
FIGS. 6 and 7 illustrate a switching transistor according to an embodiment.
Figure 7:
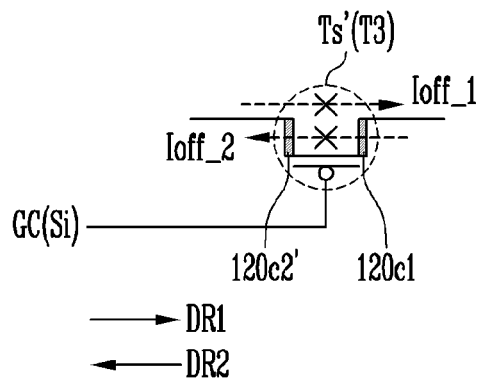
Figure 8A:
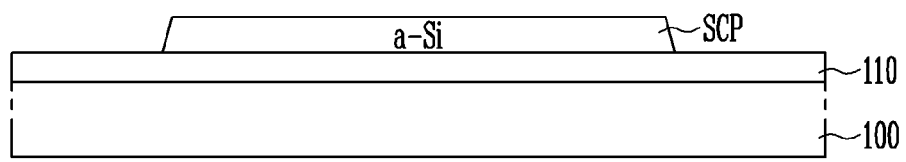
FIGS. 8A to 8I illustrate a method of manufacturing a display device according to an embodiment and illustrates a method of manufacturing a switching transistor for the display device.
Figure 8B:
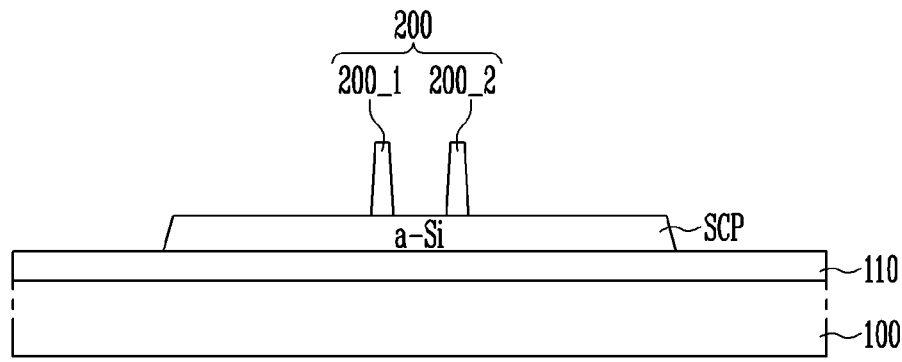
Figure 8C:
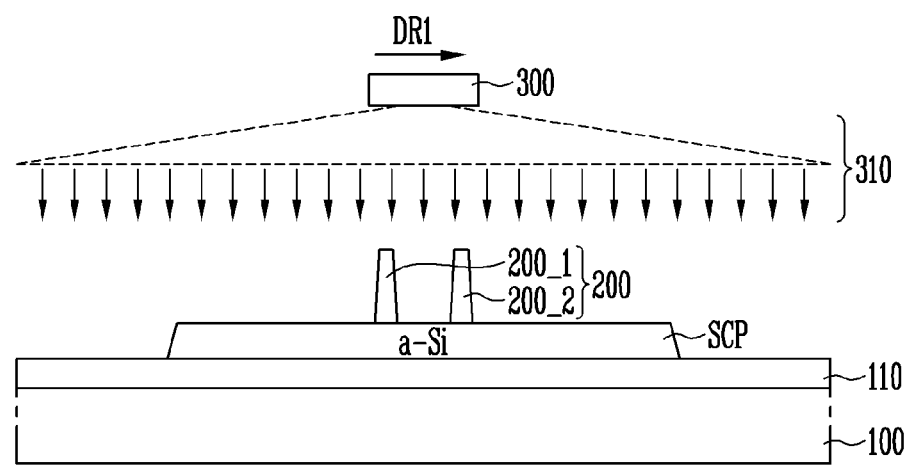
Figure 8D:
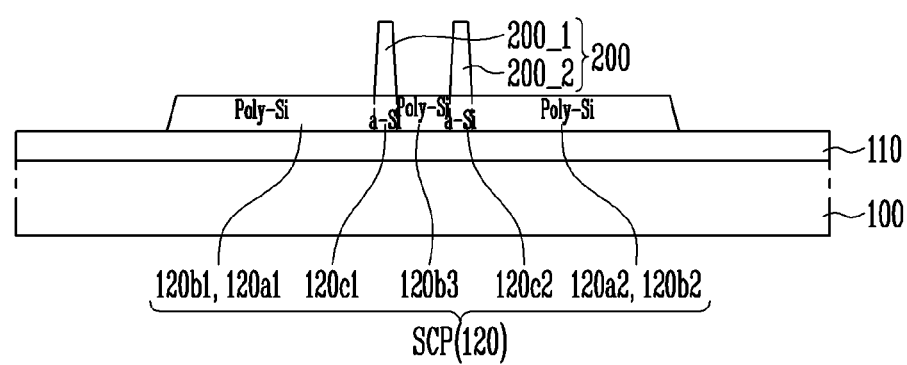
Figure 8E:
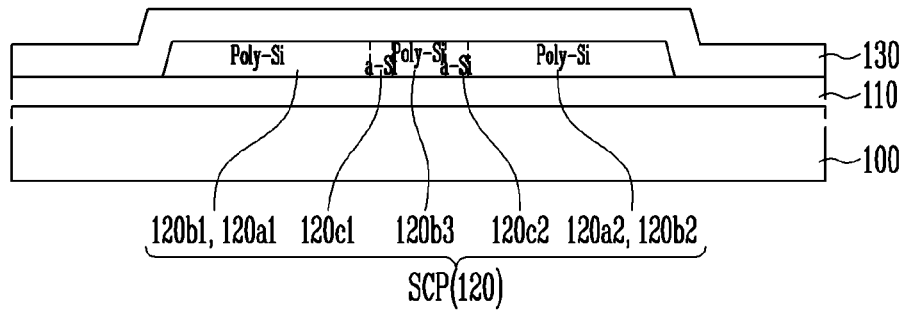
Figure 8F:
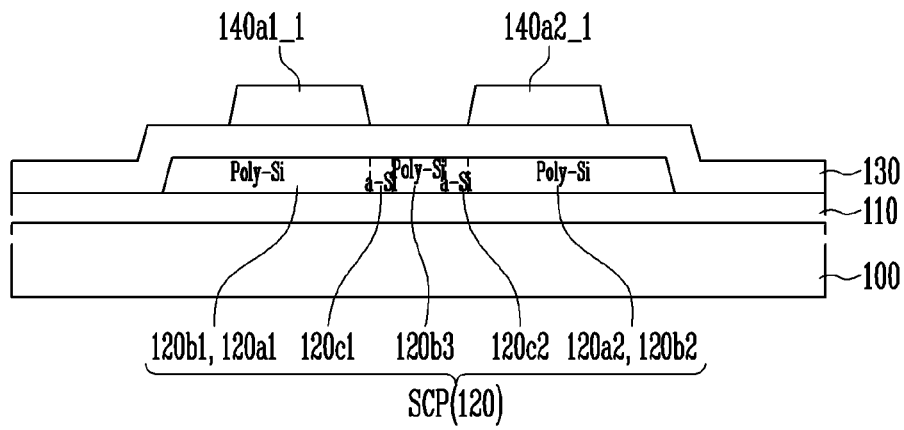
Figure 8G:
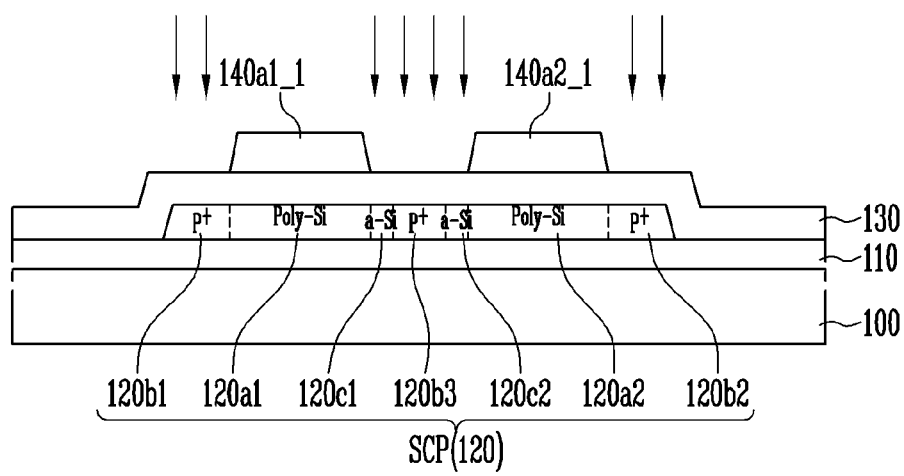
Figure 8H:
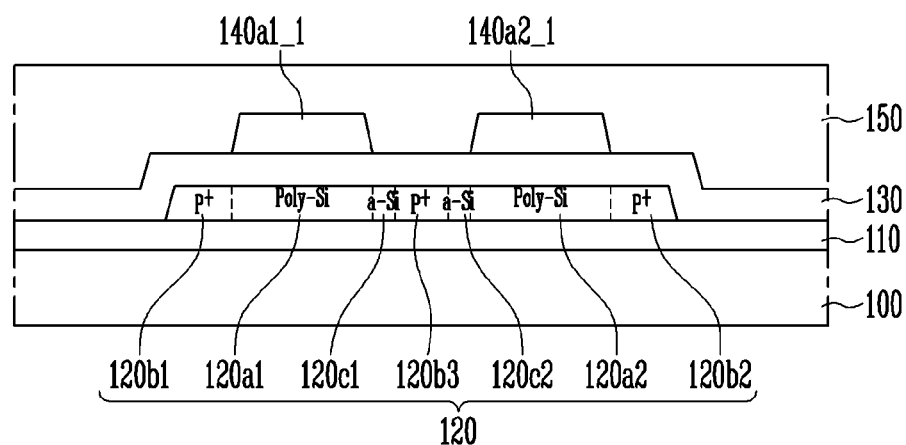
Figure 8I:
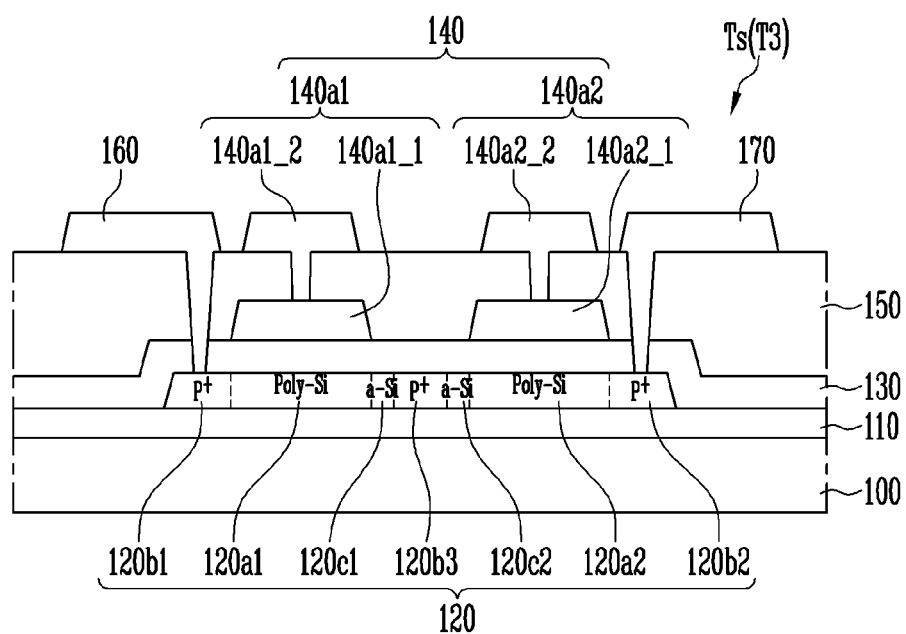

FIGS. 6 and 7 illustrate a switching transistor Ts' according to an embodiment. For example, FIG. 6 illustrates a schematic cross-sectional structure of the switching transistor Ts', and FIG. 7 illustrates an equivalent circuit diagram of the switching transistor Ts'.

According to embodiments, the switching transistor Ts' according to the embodiment of FIGS. 6 and 7 may be any one switching transistor provided in the pixel PXL according to the embodiments of FIGS. 1 to 3, for example, at least one switching transistor of the second to fourth transistors T2 to T4 with a single structure according to the embodiment of FIG. 2 and the second transistor T2 with a single structure according to the embodiment of FIG. 3. For ease of explanation, a structure of the switching transistor Ts' is illustrated in FIGS. 6 and 7, when the third transistor T3 of FIG. 2 has the structure of the switching transistor Ts' according to the embodiment. In the embodiment of FIGS. 6 and 7, the same or similar components as those of the embodiment of FIGS. 4 and 5 are denoted by the same reference numerals and signs, and redundant descriptions thereof will be omitted in so far as they have previously been described.

Referring to FIGS. 6 and 7, the switching transistor Ts' according to an embodiment may include an active layer pattern 120' including a single channel region, for example, a first channel region 120a1. The active layer pattern 120' may include a first channel region 120a1, a first conductive region 120b1 and a second conductive region 120b2 which may be respectively disposed at opposite sides of the first channel region 120a1, a first wide band-gap region 120c1 which may be disposed between the first channel region 120a1 and the second conductive region 120b2, and a second wide band-gap region 120c2' which may be disposed between the first channel region 120a1 and the first conductive region 120b1. According to embodiments, the first wide band-gap region 120c1 and the second wide band-gap region 120c2' may be respectively disposed at opposite sides of the first channel region 120a1 to be in contact with different regions of the first channel region 120a1.

The first and second wide band-gap regions 120c1 and 120c2' may be made of a material having a wider band-gap as compared with the remaining regions of the active layer pattern 120'. For example, each of the first and second wide band-gap regions 120c1 and 120c2' may be an amorphous silicon region including amorphous silicon. Each of the first channel region 120a1 and the first and second conductive regions 120b1 and 120b2 may be a polysilicon region including polysilicon. Accordingly, a band-gap of the first and second wide band-gap regions 120c1 and 120c2' may be greater than that of the first channel region 120a1 and the first and second conductive regions 120b1 and 120b2. In an example, the first and second wide band-gap regions 120c1 and 120c2' may have an energy band-gap of about 1.7 eV, and the first channel region 120a1 and the first and second conductive regions 120b1 and 120b2 may have an energy band-gap of about 1.12 eV. A leakage current of the switching transistor Ts' may be reduced or prevented due to the first and second wide band-gap regions 120c1 and 120c2'.

As an example, the switching transistor Ts' may include a single gate electrode 140' overlapping the first channel region 120a1. The gate electrode 140' may include a single layer or multiple layers. In an example, the gate electrode 140' may have a multi-layered structure including a lower electrode 140_1 positioned between a first insulating film 130 and a second insulating film 150 and an upper electrode 140_2 disposed on the second insulating film 150 and connected to the lower electrode 140_1.

As described above, the switching transistor Ts' according to the embodiment may include the first and second wide band-gap regions 120c1 and 120c2' between the first and second conductive regions 120b1 and 120b2 and the first channel region 120a1. Therefore, the switching transistor Ts' may exhibit improved leakage current characteristics (for example, low leakage current characteristics) in both directions.

In view of a first leakage current Ioff_1 in a first direction DR1 of FIG. 7, the first conductive region 120b1 and the second conductive region 120b2 may be a source region and a drain region of the switching transistor Ts', respectively. Therefore, the first leakage current Ioff_1 in the first direction DR1 may be reduced or prevented by the first wide band-gap region 120c1.

On the other hand, in view of a second leakage current Ioff_2 in a second direction DR2, the second conductive region 120b2 and the first conductive region 120b1 may be the source region and the drain region of the switching transistor Ts2, respectively. Therefore, the second leakage current Ioff_2 in the second direction DR2 may be reduced or prevented by the second wide band-gap region 120c2'.

According to embodiments, the switching transistor Ts' according to the embodiment is illustrated in FIGS. 6 and 7 as being the third transistor T3 according to the embodiment of FIG. 2, but the structure of the switching transistor Ts' according to the above-described embodiment may not be applicable only to the third transistor T3. For example, the fourth transistor T4 of FIG. 2 may be similar to the switching transistor Ts' according to the embodiment of FIGS. 6 and 7.

Alternatively, the second transistor T2 according to the embodiments of FIGS. 2 and 3 may be similar to the switching transistor Ts' according to the embodiment of FIGS. 6 and 7. For example, the second transistor T2 may include the first channel region 120a1, the first conductive region 120b1, the second conductive region 120b2, the first wide band-gap region 120c1, and the second wide band-gap region 120c2' according to the embodiment of FIGS. 6 and 7. Accordingly, it may be possible to stabilize operation of the pixel PXL and improve an expression of a gray level of the pixel PXL.

FIGS. 8A to 8I illustrate a method of manufacturing a display device according to an embodiment. In an example, FIGS. 8A to 8I illustrate a method of manufacturing a switching transistor for a display device. As an example, FIGS. 8A to 8I illustrate a method of manufacturing the switching transistor Ts according to the embodiment of FIGS. 4 and 5. However, the method of manufacturing a switching transistor is not limited thereto, and may be applied to, for example, a manufacture of the switching transistor Ts' according to the embodiment of FIGS. 6 and 7. For example, the switching transistor Ts' according to the embodiment of FIGS. 6 and 7 may have a structure partially or somewhat different from that of the switching transistor Ts according to the embodiment of FIGS. 4 and 5 in terms of the size and/or structure of the active layer pattern 120'. A process of manufacturing the switching transistor Ts' may be substantially the same as or similar to a process of manufacturing the switching transistor Ts according to the embodiment of FIGS. 4 and 5.

Referring to FIGS. 4 to 8A, after the buffer layer 110 is formed on the base layer 100, a semiconductor pattern SCP may be formed in each transistor region on the buffer layer 110 (for example, a switching transistor region in which the switching transistor Ts is to be disposed). In other embodiments, the buffer layer 110 may be omitted, and in this case, the semiconductor pattern SCP may be formed directly on one surface of the base layer 100.

The base layer 100 may be a base member for forming a panel of the display device 1. According to embodiments, the base layer 100 may be a rigid or flexible substrate or film, and the material and physical properties thereof are not particularly limited. In an example, the base layer 100 may be a rigid substrate made of glass or tempered glass, a flexible substrate (or a thin film) made of plastic or metal, or at least one layer of an insulating film, and the material and/or physical properties thereof are not particularly limited. By way of example, the base layer 100 may be transparent but is not limited thereto. In an example, the base layer 100 may be made of a transparent, semi-transparent, opaque, or reflective base member or material.

The buffer layer 110 may be formed on one surface of the base layer 100. Due to the buffer layer 110 being formed, impurities may be prevented from diffusing into circuit elements to be formed on the buffer layer 110. The buffer layer 110 may include a single layer and may include at least two layers. When the buffer layer 110 is provided in multiple layers, the layers may be made of the same material or different materials. In an example, the buffer layer 110 may be formed to include multiple layers including a silicon nitride layer ($SiN_x$) and a silicon oxide layer ($SiO_x$).

The semiconductor pattern SCP may be for forming an active layer pattern of each transistor (for example, the active layer pattern 120 of the first transistor T1). The semiconductor pattern SCP may be formed on one surface of the base layer 100 on which the buffer layer 110 may be formed. For example, a semiconductor material may be deposited on the buffer layer 110 to form a semiconductor material film, and then, the semiconductor material layer may be patterned to form each semiconductor pattern SCP.

According to embodiments, the semiconductor pattern SCP may be made of amorphous silicon a-Si. For example, an amorphous silicon film may be formed on the buffer layer 110 and then be patterned to form each semiconductor pattern SCP.

Referring to FIGS. 4 to 8B, a mask 200 may be disposed on one region of the semiconductor pattern SCP. The mask 200 may be made of a material (for example, a gate insulating film material) for forming the first insulating film 130 to be formed in a subsequent process), a photoresist, or various hard mask materials, and the material and/or physical properties thereof are not particularly limited.

According to embodiments, the mask 200 may include mask patterns for covering at least two regions of the semiconductor pattern SCP. For example, the mask 200 may include a first mask 200_1 and a second mask 200_2 which may be spaced apart from each other on the semiconductor pattern SCP to cover different regions of the semiconductor pattern SCP.

According to embodiments, the first mask 200_1 and the second mask 200_2 may partially crystallize the semiconductor pattern SCP to maintain one region of the semiconductor pattern SCP in an amorphous state. The first mask 200_1 and the second mask 200_2 may be disposed on regions in which wide band-gap regions are to be formed. For example, the first mask 200_1 may be disposed on a region (hereinafter referred to as a "first region") in which the first wide band-gap region 120c1 is to be formed. The second mask 200_2 may be disposed on a region (hereinafter referred to as a "second region") in which the second wide band-gap region 120c2 is to be formed. For example, the first mask 200_1 and the second mask 200_2 may be respectively disposed on the first region and the second region of the semiconductor pattern SCP, and the remaining regions of the semiconductor pattern SCP may be exposed.

Referring to FIGS. 4 to 8C and 8D, a crystallization process of crystallizing the remaining regions of the semiconductor pattern SCP excluding the first region and the second region may be performed. For example, a laser irradiation apparatus 300 (for example a laser bar) may be disposed on the base layer 100 on which each semiconductor pattern SCP and the mask 200 are formed. The laser irradiation apparatus 300 may be moved in one direction (for example, the first direction DR1) to irradiate a laser 310 and crystallize one region of the semiconductor pattern SCP which is not covered by the mask 200. Accordingly, the semiconductor pattern SCP may be divided into amorphous regions (for example, a-Si regions) corresponding to the first and second regions below the first mask 200_1 and the second mask 200_2 and crystalline regions (for example, poly-Si regions) corresponding to the remaining regions excluding the first region and the second region.

In an embodiment, when the switching transistor Ts includes transistors connected in series with each other as in the embodiment of FIGS. 4 and 5, the amorphous regions corresponding to the first and second regions may constitute the first wide band-gap region 120c1 and the second wide band-gap region 120c2 of the switching transistor Ts. A crystalline region between the first wide band-gap region 120c1 and the second wide band-gap region 120c2 may be subjected to a subsequent doping process and then constitute the third conductive region 120b3 of the switching transistor Ts. After the doping process, a crystalline region at one side of the first wide band-gap region 120c1 may be divided into the first channel region 120a1 and the first conductive region 120b1. A crystalline region at one side of the second wide band-gap region 120c2 may be divided into the second channel region 120a2 and the second conductive region 120b2.

In an embodiment, when the switching transistor Ts' includes a single transistor as in the embodiment of FIGS. 6 and 7, the amorphous regions corresponding to the first and second regions may constitute the second wide band-gap region 120c2' and the first wide band-gap region 120c1 of the switching transistor Ts'. A crystalline region between the first wide band-gap region 120c1 and the second wide band-gap regions 120c2' may constitute the first channel region 120a1 of the switching transistor Ts'. The remaining crystalline regions positioned at one side of the first wide band-gap region 120c1 and the second wide band-gap regions 120c2' may be subjected to a subsequent doping process and then constitute the first and second conductive regions 120b1 and 120b2 of the switching transistor Ts'.

According to embodiments, the mask 200 may be removed after the crystallization process of the semiconductor pattern SCP is completed. In an example, the mask 200 may be removed before or after a formation process of the first insulating film 130 to be followed. According to exemplary embodiments, when the mask 200 is removed after the first insulating film 130 is formed, in some processes of manufacturing the switching transistor Ts (for example, a film forming process of the first insulating film 130 and/or a doping process of forming each conductive region), the first insulating film 130 may protrude upward from the first and second regions of the semiconductor pattern SCP.

Referring to FIGS. 4 to 8E, the first insulating film 130 may be formed on the semiconductor pattern SCP on which the crystallization process may be performed. According to an embodiment, the first gate insulating film 130 may be a gate insulating film and may include at least one layer of an organic insulating film such as a silicon nitride (SiNx) film or a silicon oxide (SiOx) film. However, the material and/or physical properties of the first insulating film 130 are not limited thereto and may be variously changed or modified according to embodiments.

Referring to FIGS. 4 to 8F, the gate electrode 140 may be formed on the semiconductor pattern SCP to be positioned on one region of the crystalline region corresponding to each channel region. In an example, the lower electrodes 140a1_1 and 140a2_1 of the first and second gate electrodes 140a1 and 140a2 may be formed on the semiconductor pattern SCP to be positioned on the first channel region 120a1 and the second channel region 120a2, respectively.

Referring to FIGS. 4 to 8G, other regions of the crystalline region not covered by the gate electrode 140 may be highly doped with impurities using the gate electrode 140 (for example, the lower electrodes 140a1_1 and 140a2_1 of the first and second gate electrodes 140a1 and 140a2) formed on the first insulating film 130 as a mask. Accordingly, the active layer pattern 120 may be formed by forming each conductive region.

In an embodiment, when the switching transistor Ts includes transistors connected in series with each other as in the embodiment of FIGS. 4 and 5, one region between channel regions (for example, the first and second channel regions 120a1 and 120a2) of the transistors may be doped with impurities to form the third conductive region 120b3. The third conductive region 120b3 may be formed between the first wide band-gap region 120c1 and the second wide band-gap region 120c2. Since the first and second wide band-gap regions 120c1 and 120c2 are amorphous regions that are not crystallized, even when impurities are implanted, the first and second wide band-gap regions 120c1 and 120c2 have a band-gap wider than that of the remaining crystallized regions. Accordingly, wide band-gap regions (for example, the first wide band-gap region 120c1 and the second wide band-gap region 120c2) may be positioned between the third conductive region 120b3 and the channel regions (for example, between the first channel region 120a1 and the third conductive region 120b3 and between the third conductive region 120b3 and the second channel region 120a2.

In an embodiment, when the switching transistor Ts' includes a single transistor as in the embodiment of FIGS. 6 and 7, the gate electrode 140' (for example, the lower electrode 140_1 of the gate electrode 140') may be disposed on a region between the first wide band-gap region 120c1 and the second wide band-gap region 120c2 to block the implantation of impurities, thereby forming the first channel region 120a1. For example, according to embodiments, wide band-gap regions (for example, the first wide band-gap region 120c1 and the second wide band-gap region 120c2) may be respectively formed at opposite sides of the first channel region 120a1.

In the doping process, impurities may also doped into both ends of the semiconductor pattern SCP. Accordingly, the first and second conductive regions 120b1 and 120b2 may be formed at both ends of the semiconductor pattern SCP.

According to embodiments, the impurity may be p-type impurity including boron (B) or the like. For example, boron (B) ions may be ion-implanted into the semiconductor pattern SCP in a dose amount in a range of about 0.1 E12/cm2 to about 7 E12/cm2. However, the type and doping concentration of the impurity are not particularly limited in the disclosure, which may be variously changed according to the types or characteristics of the switching transistors Ts and Ts' to be formed. In an example, when the switching transistors Ts and Ts' are to be formed as n-types, n-type impurities may be doped into the first, second, and third conductive regions 120b1, 120b2, and 120b3.

Referring to FIGS. 4 to 8H, the second insulating film 150 may be formed on the lower electrodes 140a1_1 and 140a2_1 of gate electrodes, i.e., the first and second gate electrodes 140a1 and 140a2. According to embodiments, the second insulating film 150 may be an interlayer insulating film and may be formed to include a single layer or multiple layers through a film forming process of at least one layer of an insulating film and/or an inorganic insulating film. The material and/or physical properties of the second insulating film 150 are not particularly limited and may be variously changed according to embodiments. According to embodiments, the second insulating film 150 may be formed to have a flat surface through a chemical mechanical polishing process.

Referring FIGS. 4 to 8I, the first electrode 160 and the second electrode 170 respectively connected to the first conductive region 120b1 and the second conductive region 120b2 may be formed on the second insulating film 150. When the gate electrodes, for example, the first and second gate electrodes 140a1 and 140a2 each have a multi-layered structure, the upper electrodes 140a1_2 and 140a2_2 of the first and second gate electrodes 140a1 and 140a2 may be formed concurrently in a process of forming the first electrode 160 and the second electrode 170.

Figure 9:
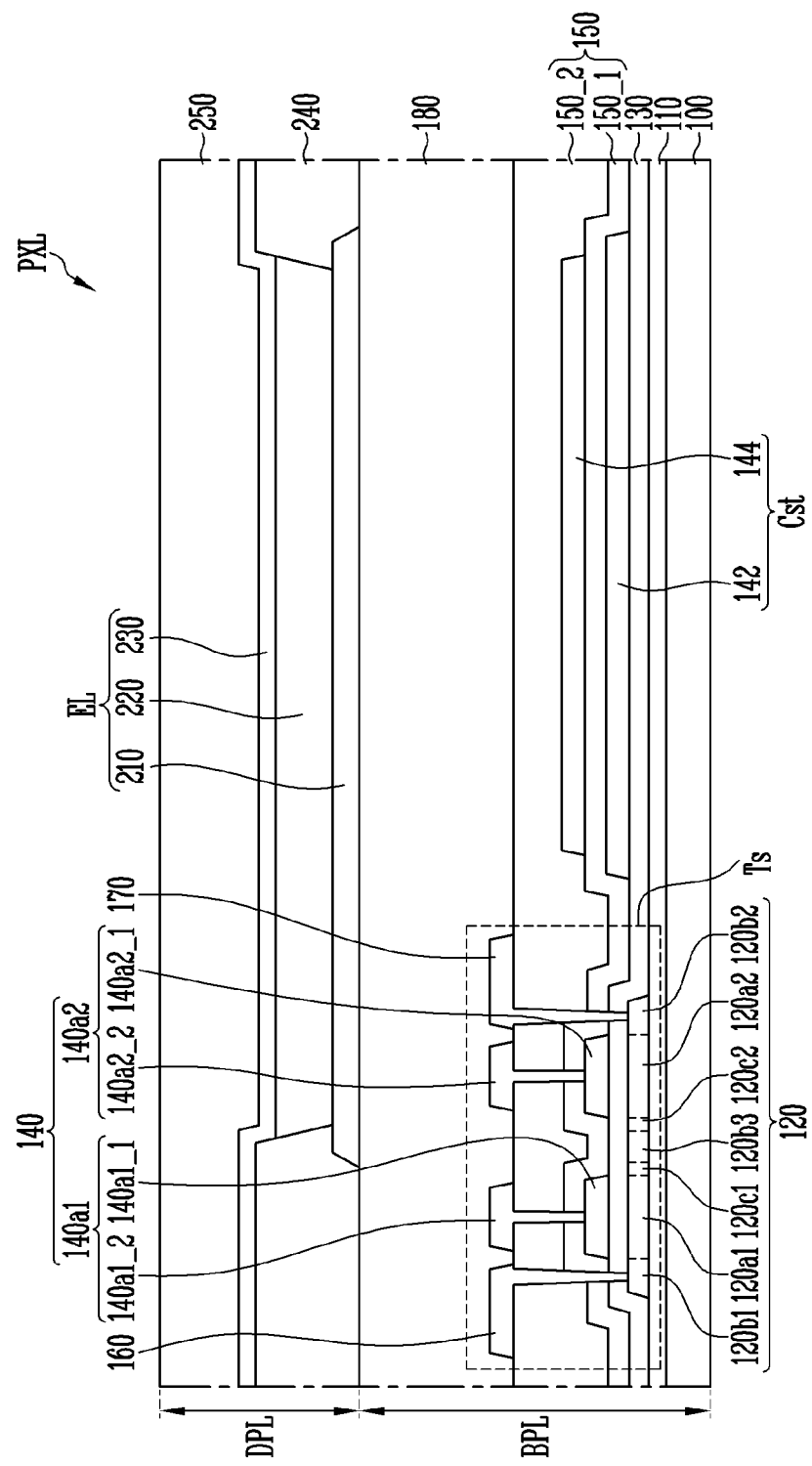
FIG. 9 illustrates a pixel including a switching transistor according to an embodiment.

FIG. 9 illustrates a pixel PXL including a switching transistor Ts according to an embodiment. For convenience, FIG. 9 illustrates the pixel PXL including the switching transistor Ts according to the embodiment of FIGS. 4 and 5. When the pixel PXL includes the switching transistor Ts' according to the embodiment of FIGS. 6 and 7, only the structure of the switching transistor Ts' may be partially changed, and the remaining components may be substantially the same or similar to those of the pixel PXL disclosed in FIG. 9. In an embodiment of FIG. 9, the same or similar components as those of the above-described embodiments are denoted by the same reference numerals and signs, and redundant descriptions thereof will be omitted in so far as they have previously been described.

Referring to FIGS. 1 to 9, the pixel PXL may include various circuit elements including the switching transistor Ts and a storage capacitor Cst, and a light-emitting element EL. For example, the pixel PXL and a display panel including the same may include a backplane layer BPL (also referred to as a "circuit element layer" or "circuit layer") in which circuit elements of each pixel PXL and wires connected thereto may be disposed, and a display element layer DPL which may be disposed on the backplane layer BPL and on which the light-emitting element EL of each pixel PXL may be disposed.

According to embodiments, the storage capacitor Cst may include a lower electrode 142 and an upper electrode 144 which may be each disposed on the same layer as or a different layer from one electrode of the switching transistor Ts. In an example, the lower electrode 142 of the storage capacitor Cst may be disposed on a first insulating film 130 together with lower electrodes 140a1_1 and 140a2_1 of first and second gate electrodes 140a1 and 140a2. The upper electrode 144 of the storage capacitor Cst may be disposed on a different layer from electrodes of the switching transistor Ts.

For example, the second insulating film 150 may have a multi-layered structure including a lower insulating film 150_1 and an upper insulating film 150_2. The upper electrode 144 of the storage capacitor Cst may be disposed between the lower insulating film 150_1 and the upper insulating film 150_2 of the second insulating film 150.

In an embodiment, upper electrodes 140a1_2 and 140a2_2 of the first and second gate electrodes 140a1 and 140a2 may be disposed on the second insulating film 150 together with first and second electrodes 160 and 170, however, the disclosure is not limited thereto. For example, in an embodiment, the upper electrodes 140a1_2 and 140a2_2 of the first and second gate electrodes 140a1 and 140a2 may also be disposed on the lower insulating film 150_1 of the second insulating film 150 together with the upper electrode 144 of the storage capacitor Cst.

For example, the structures and positions of various circuit elements, wires, and insulating films formed in the backplane layer BPL may be variously changed or modified according to embodiments. A third insulating film 180 may be disposed on the circuit elements and the wires.

The third insulating film 180 may include a single layer or multiple layers. When the third insulating film 180 is provided to include the multiple layers, the layers may be made of the same or similar material or different materials. In an example, the third insulating film 180 may include multiple layers including a first passivation layer composed of at least one inorganic insulating film and a second passivation layer composed of at least one organic insulating film. When the third insulating film 180 includes at least one layer of the organic insulating film, a surface of the backplane layer BPL may be substantially planarized.

The display element layer DPL may include the light-emitting element EL and may further include a bank structure for defining an emission region (for example, an emission region of each pixel PXL) in which each light-emitting element EL may be disposed, for example, a pixel definition film 240. A protective layer 250 may be disposed on the light-emitting element EL and the pixel definition film 240.

The light-emitting element EL may include a first electrode 210, a light-emitting layer 220, and a second electrode 230 which may be sequentially stacked on the third insulating film 180. According to embodiments, one of the first and second electrodes 210 and 230 of the light-emitting element EL may be an anode electrode, and the other thereof may be a cathode electrode. For example, when the first electrode 210 is the anode electrode, the second electrode 230 may be the cathode electrode.

The first electrode 210 of the light-emitting element EL may be disposed on the third insulating film 180 and may be connected to at least one circuit element constituting each pixel circuit PXC through a contact hole or the like which is not shown. In an example, the first electrode 210 may be connected to one electrode of sixth and seventh transistors T6 and T7 through a contact hole or a via hole passing through the third insulating film 180.

The pixel definition film 240 that may partition an emission region of a corresponding pixel PXL may be formed in each pixel region in which the first electrode 210 may be formed. The pixel definition film 240 may be disposed between the emission regions of the pixels PXL and may have an opening that exposes the first electrode 210 in the emission region of each pixel PXL. For example, the pixel definition film 240 may extend upward from one surface of the base layer 100 on which the first electrode 210 or the like is formed, along an outer periphery of the emission area of each pixel PXL.

The light-emitting layer 220 may be formed in each emission region surrounded by the pixel definition film 240. In an example, the light-emitting layer 220 may be disposed on an exposed surface of the first electrode 210. According to embodiments, the light-emitting layer 220 may have a multi-layered thin film structure including a light generation layer. For example, the light-emitting layer 220 may include the light generation layer to emit light with a certain color, a first common layer disposed between the light generation layer and the first electrode 210, and a second common layer disposed between the light generation layer and the second electrode 230. According to embodiments, the first common layer may include at least one of a hole injection layer and a hole transport layer. According to embodiments, the second common layer may include at least one of a hole blocking layer, an electron transport layer, and an electron injection layer. According to embodiments, the light generation layer may be individually patterned to correspond to each emission region. The first common layer and the second common layer may be entirely formed on the display region 10 in which the pixels PXL may be disposed.

The second electrode 230 of the light-emitting element EL may be formed on the light-emitting layer 220. According to embodiments, the second electrode 230 may be entirely formed on the display region 10, but the disclosure is not limited thereto.

The protective layer 250 may be formed on the light-emitting element EL to cover the second electrode 230 of the light-emitting element EL. According to embodiments, the protective layer 250 may include an encapsulation layer or an encapsulation substrate for sealing the pixels, which may be disposed on one region (at least a display region 10) of the display panel on which the pixels PXL may be disposed. For example, the protective layer 250 may include a thin film encapsulation layer (TFE). When the TEF is formed to seal the display region 10, a thickness of the display panel may be reduced and flexibility may be secured while the pixels PXL are protected.

In embodiments, the protective layer 250 may have a single-layered or multi-layered structure. In an example, the protective layer 250 may include multiple films including at least two inorganic films overlapping each other and at least one organic film interposed between the inorganic films. However, the structure and material of the protective layer 250 may be variously changed or modified according to embodiments.

In the disclosure, the structures of the pixel PXL and the display panel including the same are not limited to the embodiment shown in FIG. 9, and may be variously changed or modified according to embodiments. For example, the pixel PXL and the display panel including the same may be formed in various structures within the spirit and scope of the disclosure.

Figure 10:
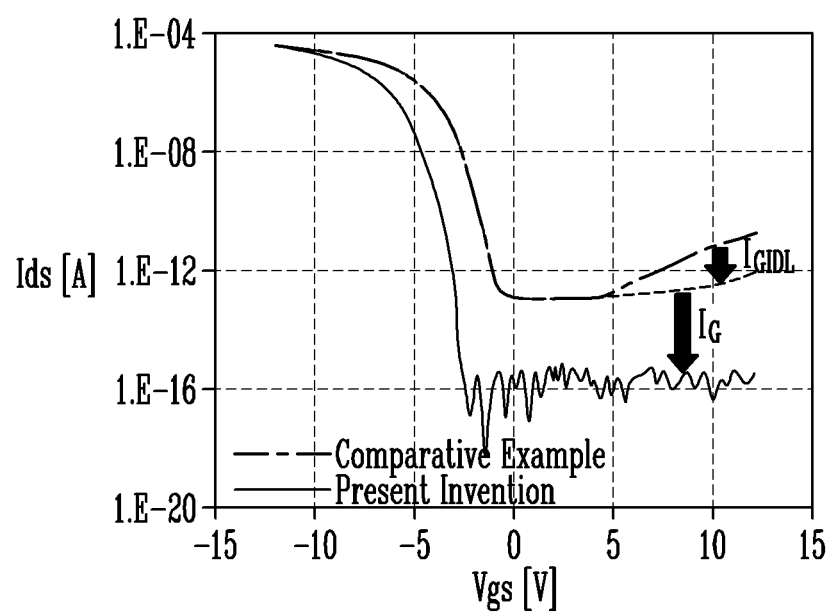
FIG. 10 is a graph showing leakage current characteristics of switching transistors according to an embodiment.

FIG. 10 is a graph showing leakage current characteristics of the switching transistors Ts and Ts' according to an embodiment. For example, FIG. 10 illustrates a drain-source current Ids according to a gate-source voltage Vgs of the switching transistors Ts and Ts' including a wide band-gap region between each channel region and a drain region.

Referring to FIGS. 1 to 10, the switching transistors Ts and Ts' according to an embodiment may include a wide band-gap region on at least one side of each channel region. Thus, a leakage current may be lower in an off section (for example, a section in which the gate-source voltage Vgs is a high positive voltage) as compared with a transistor of Comparative Example not including the wide band-gap region. For example, in regard to the switching transistors Ts and Ts' according to an embodiment, a leakage current may be considerably lowered due to reductions in thermal generation current $I_G$ and gate-induced-drain-leakage current $I_{GIDL}$ as compared with the transistor of Comparative Example which does not include the wide band-gap region between each channel region and the drain region.

In an embodiment, instead of forming the wide band-gap region between each channel region and the drain region, a low concentration doped region (hereinafter referred to as an "LDD region") may be formed. In this case, however, the magnitude of an electric field may be changed by the LDD region, and thus, the gate-induced-drain-leakage current $I_{GIDL}$ may be reduced, but the thermal generation current $I_G$ may not be reduced. This is because the gate-induced-drain-leakage current $I_{GIDL}$ is a current having both a band-gap and the magnitude of an electric field as variables, but the thermal generation current $I_G$ is a current having a band-gap as a variable irrespective of the magnitude of an electric field.

When the LDD region is formed instead of the wide band-gap region and lengths of the active layer patterns 120 and 120' are reduced, it may be difficult to obtain an effect of reducing a leakage current through the LDD region. For example, when the lengths of the active layer patterns 120 and 120' are reduced, a formation length of the LDD region may be reduced. Thus, due to length dispersion and/or dose dispersion of the LDD region, it may be difficult to obtain a desired effect of reducing a leakage current.

On the other hand, as in the above-described embodiments, in the switching transistors Ts and Ts' having the wide band-gap region formed between each channel region and the drain region, even when lengths of the active layer patterns 120 and 120' are reduced, excellent leakage current characteristics may be exhibited as compared with a transistor adopted with the LDD region. For example, according to various embodiments, a wide band-gap region may be formed between each channel region and a drain region, thereby more effectively preventing or reducing a leakage current.

According to a display device and a method of manufacturing the same according to an embodiment, a leakage current of a pixel may be effectively reduced or prevented. Accordingly, an expression of a gray level of the pixel may be increased, and image quality of the display device may be improved.

The spirit and scope of the disclosure has been described according to embodiments, but it is to be noted that the embodiments are provided for the description thereof and are not for the limitation thereof. Further, those skilled in the art will appreciate that various modifications may be made without departing from the spirit and scope of the disclosure.

The scope of the disclosure is not limited to the details described in the detailed description of the specification but should be defined by the claims. In addition, it shall be understood that all modifications and embodiments conceived from the meaning and scope of the claims and their equivalents are included in the scope of the disclosure.

What is claimed is:

1. A display device comprising a pixel disposed in a display region, wherein the pixel includes:
   a light-emitting element connected between a first power source and a second power source;
   a first transistor connected between the first power source and the light-emitting element to control a driving current flowing in the light-emitting element in response to a voltage of a first node; and
   at least one switching transistor to transmit a data signal or a voltage of an initialization power source to the first node,
   wherein the at least one switching transistor includes:
      a first channel region;
      a first conductive region and a second conductive region, each of which are respectively disposed at opposite sides of the first channel region so as to not overlap the first channel region in plan view; and
      a first wide band-gap region disposed between the first channel region and the second conductive region.

2. The display device of claim 1, wherein
   the first channel region, the first conductive region, and the second conductive region include polysilicon, and
   the first wide band-gap region includes amorphous silicon.

3. The display device of claim 1, wherein the at least one switching transistor includes a plurality of transistors connected in series with each other between a source of the data signal or initialization power source and the first node.

4. The display device of claim 3, wherein
   the at least one switching transistor further includes:
      a second channel region disposed between the first channel region and the second conductive region;
      a third conductive region disposed between the first channel region and the second channel region; and
      a second wide band-gap region disposed between the second channel region and the third conductive region, and the first wide band-gap region is disposed between the first channel region and the third conductive region.

5. The display device of claim 4, wherein the first wide band-gap region is in direct contact with the first channel region and the third conductive region, and
the second wide band-gap region is in direct contact with the second channel region and the third conductive region.

6. The display device of claim 4, wherein the at least one switching transistor includes:
a first gate electrode overlapping the first channel region; and
a second gate electrode overlapping the second channel region, and
the first gate electrode and the second gate electrode are electrically connected to each other.

7. The display device of claim 1, wherein the at least one switching transistor further includes a second wide band-gap region disposed between the first channel region and the first conductive region.

8. The display device of claim 7, wherein each of the first wide band-gap region and the second wide band-gap region includes amorphous silicon.

9. The display device of claim 1, wherein the at least one switching transistor includes at least one of:
a second transistor connected between a first electrode of the first transistor and a data line, the second transistor including a gate electrode connected to a scan line;
a third transistor connected between a second electrode of the first transistor and the first node, the third transistor including a gate electrode connected to the scan line; and
a fourth transistor connected between the first node and the initialization power source, the fourth transistor including a gate electrode connected to a first control line.

10. The display device of claim 9, wherein the third transistor includes:
the first channel region;
the first conductive region;
the second conductive region; and
the first wide band-gap region.

11. The display device of claim 10, wherein the third transistor includes a plurality of transistors connected in series with each other.

12. The display device of claim 11, wherein the third transistor further includes:
a second channel region disposed between the first channel region and the second conductive region;
a third conductive region disposed between the first channel region and the second channel region; and
a second wide band-gap region disposed between the second channel region and the third conductive region, and
the first wide band-gap region is disposed between the first channel region and the third conductive region.

13. The display device of claim 12, wherein the third transistor includes;
a first gate electrode overlapping the first channel region; and
a second gate electrode overlapping the second channel region, and
the first gate electrode and the second gate electrode are commonly connected to the scan line.

14. The display device of claim 9, wherein the fourth transistor includes:
the first channel region;
the first conductive region;
the second conductive region; and
the first wide band-gap region.

15. The display device of claim 9, wherein the fourth transistor includes a plurality of transistors connected in series with each other.

16. The display device of claim 9, wherein the second transistor includes:
the first channel region;
the first conductive region;
the second conductive region;
the first wide band-gap region; and
a second wide band-gap region disposed between the first channel region and the first conductive region.

17. The display device of claim 1, wherein
the pixel includes a plurality of switching transistors, and
a predetermined number of the switching transistors include the first wide band-gap region.

18. The display device of claim 1, wherein
at least one of the first conductive region and the second conductive region have an energy band-gap of about 1.12 eV, and
the wide band-gap region has an energy band-gap of about 1.7 eV.

19. The display device of claim 1, wherein the at least one switching transistor further includes a gate electrode that does not overlap the first wide band-gap region in plan view.

20. The display device of claim 1, wherein the at least one switching transistor further includes a gate electrode that does not overlap the first conductive region and the second conductive region in plan view.

21. The display device of claim 1, wherein
the first channel region includes a first main surface facing a gate electrode, a second main surface opposite the first main surface and facing away from the gate electrode, and a side surface connecting the first main surface and the second main surface, and
the first wide band-gap region directly contacts the side surface of the first channel region.

22. A method of manufacturing a display device including a switching transistor, the method comprising:
forming a semiconductor pattern in a switching transistor region;
disposing a first mask and a second mask on a first region and a second region, respectively, of the semiconductor pattern and exposing remaining regions of the semiconductor pattern;
crystallizing the remaining regions of the semiconductor pattern to divide amorphous regions corresponding to the first and second regions and crystalline regions corresponding to the remaining regions;
forming a first insulating film on the semiconductor pattern;
forming a gate electrode on a region of the crystalline region; and
doping another region of the crystalline region with impurities using the gate electrode as a mask,
wherein doping another region of the crystalline region with impurities using the gate electrode as a mask includes doping the amorphous regions.

23. The method of claim 22, further comprising:
forming the switching transistor to include a plurality of transistors connected in series with each other;
doping a region between channel regions of the transistors with impurities to form a conductive region; and forming the amorphous regions between the conductive region and the channel regions.

24. The method of claim 22, further comprising:
forming the switching transistor as a single transistor; and
forming the amorphous regions at opposite sides of the crystalline region overlapping the gate electrode.

\* \* \* \* \*